US006537718B2

(12) United States Patent
Nishiyama et al.

(10) Patent No.: US 6,537,718 B2
(45) Date of Patent: Mar. 25, 2003

(54) POSITIVE PHOTORESIST COMPOSITION FOR EXPOSURE TO FAR ULTRAVIOLET RAY

(75) Inventors: Fumiyuki Nishiyama, Shizuoka (JP); Toru Fujimori, Shizuoka (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 60 days.

(21) Appl. No.: 09/742,368

(22) Filed: Dec. 22, 2000

(65) Prior Publication Data

US 2001/0008739 A1 Jul. 19, 2001

(30) Foreign Application Priority Data

Dec. 22, 1999 (JP) .......................................... 11-364904

(51) Int. Cl.[7] ................................................ G03F 7/039

(52) U.S. Cl. .................... 430/170; 430/270.1; 430/326; 430/905; 430/176; 522/31; 522/32

(58) Field of Search ............................. 430/270.1, 170, 430/905, 326, 176; 522/31, 32

(56) References Cited

U.S. PATENT DOCUMENTS 4,491,628 A 1/1985 Ito et al. ..................... 430/176
5,580,695 A * 12/1996 Murata et al. ........... 430/270.1
6,114,086 A * 9/2000 Kobayashi et al. ...... 430/270.1
6,190,833 B1 * 2/2001 Shiota et al. ............... 430/192
6,338,931 B1 * 1/2002 Maeda et al. ............... 430/170

FOREIGN PATENT DOCUMENTS

| | | | |
|---|---|---|---|
| EP | 0 249 139 | 6/1987 | ............. G03F/7/10 |
| JP | 48-89003 | 11/1973 | ............. 116/415 A |
| JP | 51-120714 | 10/1976 | ............ G03C/1/72 |
| JP | 53-133429 | 11/1978 | ............ G03C/1/72 |

* cited by examiner

*Primary Examiner*—John S. Chu
(74) *Attorney, Agent, or Firm*—Sughrue Mion, PLLC

(57) ABSTRACT

A positive photoresist composition for exposure to a far ultraviolet ray which comprises (A) a compound which generates an acid upon irradiation with an actinic ray or radiation, (B) a resin which contains a repeating unit corresponding to hydroxystyrene and solubility of which increases in an alkaline developing solution by the action of an acid, and (C) (1) at least one solvent selected from the group consisting of propylene glycol monomethyl ether acetate and propylene glycol monomethyl ether propionate, and (2) at least one solvent selected from the group consisting of propylene glycol monomethyl ether and ethoxyethyl propionate. The positive photoresist composition of the present invention is suitable for exposure to a far ultraviolet ray, particularly a KrF excimer laser beam, is improved in line edge roughness and micro grain, is excellent in uniformity of carting on a substrate and has less particles in its resist solution.

15 Claims, No Drawings

POSITIVE PHOTORESIST COMPOSITION FOR EXPOSURE TO FAR ULTRAVIOLET RAY

FIELD OF THE INVENTION

The present invention relates to a positive photosensitive composition for use in the production of a lithographic printing plate, a semiconductor such as IC, a circuit board for liquid crystal and thermal head and in other photofabrication processes.

BACKGROUND OF THE INVENTION

As the photosensitive composition for use in the production of a lithographic printing plate, a semiconductor such as IC, a circuit board for liquid crystal and thermal head and in other photofabrication processes, various compositions are known and photoresist photosensitive compositions are ordinarily employed. The photoresist compositions are widely divided into positive photoresist compositions and negative photoresist compositions.

One of the positive photoresist photosensitive compositions is a chemical amplification-type resist composition as described in U.S. Pat. No. 4,491,628 and European Patent No. 249,139. The chemical amplification-type positive resist composition is a pattern formation material which generates an acid in an exposed area upon irradiation with a radiation such as a far ultraviolet ray and due to a reaction using the acid as a catalyst, solubility in a developing solution differentiates in the area irradiated with the active radiation from the non-irradiated area to form a pattern on a substrate.

Examples of such a resist composition include combinations of a compound capable of generating an acid by photolysis with an acetal or O,N-acetal compound as described in JP-A-48-89003 (the term "JP-A" as used herein means an "unexamined published Japanese patent application"), with an ortho ester or amide acetal compound as described in JP-A-51-120714, with a polymer having an acetal or ketal group on the main chain as described in JP-A-53-133429, with an enol ether compound as described in JP-A-55-12995, with an N-acyliminocarbonic acid compound as described in JP-A-55-126236, with a polymer having an ortho ester group on the main chain as described in JP-A-56-17345, with a tertiary alkyl ester compound as described in JP-A-60-3625, with a silyl ester compound as described in JP-A-60-10247 or with a silyl ether compound as described in JP-A-60-37549 and JP-A-60-121446. These combinations exhibit high photosensitivity since they have in principle a quantum yield exceeding 1.

A system which is stable at a room temperature but decomposes by heating in the presence of an acid to become alkali-soluble is also known and examples thereof include combinations of a compound capable of generating an acid on exposure with an ester or carbonic acid ester compound having a tertiary or secondary carbon (e.g., tert-butyl or 2-cyclohexenyl) as described, for example, in JP-A-59-45439, JP-A-60-3625, JP-A-62-229242, JP-A-63-27829, JP-A-63-36240, JP-A-63-250642, *Polym. Eng. Sce.,* Vol. 23, page 1012 (1983), *ACS. Sym.,* Vol. 242, page 11 (1984), *Semiconductor World,* November, 1987, page 91, *Macromolecules,* Vol. 21, page 1475 (1988), and *SPIE,* Vol. 920, page 42 (1988). Since such a system has high photosensitivity and a little absorption in a far ultraviolet region, it is suitable for ultra fine fabrication using a light source having a shorter wavelength.

In general, the chemical amplification-type positive photoresist composition is roughly divided into two types. Specifically, there are a chemical amplification positive photoresist of three-component type comprising an alkali-soluble resin, a compound capable of generating an acid upon irradiation with a radiation (hereinafter also referred to as a "photo-acid generator" sometimes) and a compound which has an acid-decomposable group and prevents the alkali-soluble resin from dissolution and a chemical amplification positive photoresist of two-component type comprising a resin having a group capable of being decomposed by a reaction with an acid to become alkali-soluble and a photo-acid generator.

The two-component or tree-component chemical amplification positive photoresist composition is subjected to exposure to generate an acid from the photo-acid generator, heat treatment and development thereby obtaining a resist pattern.

These photoresist compositions, particularly photoresist compositions for exposure to a far ultraviolet ray still have problems in the properties such as line edge roughness and micro grain (an extraneous substance on the surface of a resist film) which are desired to be solved. The line edge roughness means unevenness of edge which occurs at an edge between a line pattern of resist and a surface of a substrate irregularly fluctuates in a direction vertical to the line due to the characteristics of resist, when the pattern is observed from just above. The unevenness is transferred in an etching step in which the resist acts as a mask and thus, electric properties are damaged thereby decreasing yield. The occurrence of micro grain results in degradation of reproducibility in the etching step thereby decreasing yield.

SUMMARY OF THE INVENTION

Therefore, an object of the present invention is to provide a positive photoresist composition for exposure to a far ultraviolet ray which is improved in line edge roughness and micro grain, which is excellent in uniformity of a resist film formed and which has less particles in its resist solution.

Other objects of the present invention will become apparent from the following description.

As a result of intensive investigations made by the inventors on materials for the chemical amplification-type positive photoresist compositions, it has been found that the objects of the present invention are successfully accomplished by using a specific acid-decomposable resin and a specific mixed solvent described below to complete the present invention.

Specifically, the present invention includes the following positive photoresist compositions:

(1) a positive photoresist composition for exposure to a far ultraviolet ray which comprises (A) a compound which generates an acid upon irradiation with an actinic ray or radiation, (B) a resin which contains a repeating unit corresponding to hydroxystyrene and solubility of which increases in an alkaline developing solution by the action of an acid, and (C) (1) at least one solvent selected from the group consisting of propylene glycol monomethyl ether acetate and propylene glycol monomethyl ether propionate, and (2) at least one solvent selected from the group consisting of propylene glycol monomethyl ether and ethoxyethyl propionate, (2) the positive photoresist composition for exposure to a far ultraviolet ray as described in item (1) above, wherein the composition further comprises at least one solvent selected from the group consisting of γ-butyrolactone, ethylene carbonate and propylene carbonate, and (3) the positive photoresist composition for exposure to a far ultraviolet ray as described in item (1) above, wherein the resin (B) contains a repeating unit represented by formula (IV) shown below and a repeating unit represented by formula (V) shown below:

(IV)

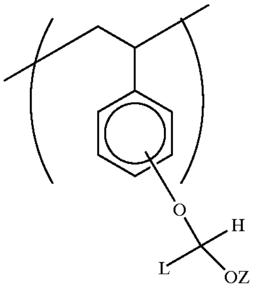

(V)

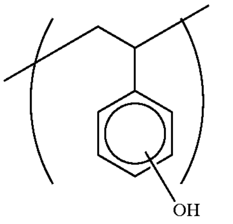

wherein L represents a hydrogen atom, a straight-chain, branched chain or cyclic alkyl group which may be substituted or an aralkyl group which may be substituted; Z represents a straight-chain, branched chain or cyclic alkyl group which may be substituted or an aralkyl group which may be substituted; or Z and L may be combined with each other to form a 5-membered or 6-membered ring.

DETAILED DESCRIPTION OF THE INVENTION

The compounds for use in the photoresist composition of the present invention will be described in greater detail below.

<(A) Compound Which Generates an Acid Upon Irradiation with an Actinic Ray or Radiation (Photo-acid Generator)>

The photo-acid generator (A) for use in the present invention is a compound which generates an acid upon irradiation with an actinic ray or radiation.

The photo-acid generator for use in the present invention can be appropriately selected from photo-initiators for photo-cation polymerization, photoinitiators for photo-radical polymerization, photo-achromatizing agents for dyes, photo-discoloring agents, known compounds used in a microresist or the like, which generate an acid by light (an ultraviolet ray or far ultraviolet ray of from 200 to 400 nm, particularly preferably, a g-line, h-line, i-line or KrF excimer laser beam), an ArF excimer laser beam, an electron beam, an X ray, a molecular beam or an ion beam, and a mixture of these compounds.

Other examples of the photo-acid generator for use in the present invention include onium salts such as diazonium salts, ammonium salts, phosphonium salts, iodonium salts, sulfonium salts, selenonium salts or arsonium salts, organic halide compounds, organic metal/organic halide compounds, photo-acid generators having an o-nitrobenzyl type protective group, compounds which photolyze to generate a sulfonic acid, represented by iminosulfonate and the like, disulfone compounds, diazoketosulfone compounds and diazodisulfone compounds.

Also, polymer compounds having the group or compound generating an acid by light introduced into the main or side chain thereof may be used.

Further, compounds which generate an acid by light as described in V. N. R. Pillai, *Synthesis,* (1), 1 (1980), A. Abad et al., *Tetrahedron Lett.,* (47) 4555 (1971), D. H. R. Barton et al., *J. Chem. Soc.,* (C), 329 (1970), U.S. Pat. No. 3,779,778 and European Patent 126,712 may be used.

Among the above-described photo-acid generators, those which can be particularly effectively used are described below.

(1) Oxazole derivative represented by formula (PAG1) shown below or s-triazine derivative represented by formula (PAG2) shown below, substituted with a trihalomethyl group:

(PAG1)

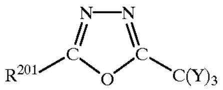

(PAG2)

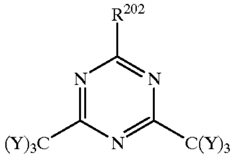

wherein $R^{201}$ represents a substituted or unsubstituted aryl group or alkenyl group, $R^{202}$ represents a substituted or unsubstituted aryl group, alkenyl group or alkyl group, or $-C(Y)_3$, and Y represents a chlorine atom or a bromine atom.

Specific examples thereof include the following compounds, however, the present invention should not be construed as being limited thereto.

(PAG1-1)

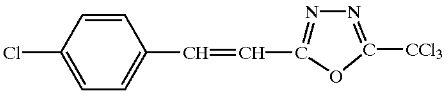

(PAG1-2)

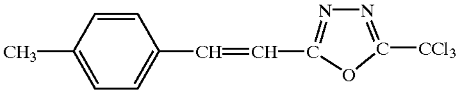

(PAG1-3)

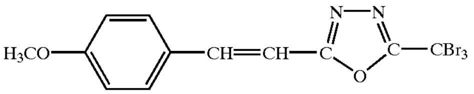

(PAG1-4)

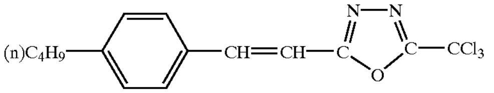

(PAG1-5)

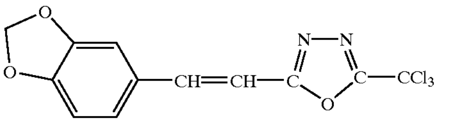

(PAG1-6)

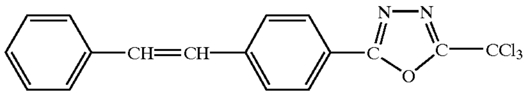

-continued
(PAG1-7)
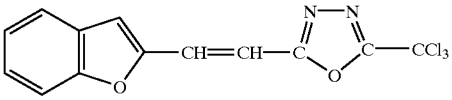
(PAG1-8)
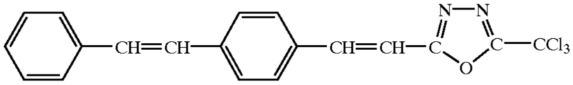
(PAG2-1)
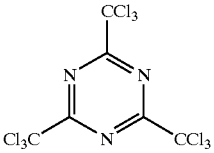
(PAG2-2)
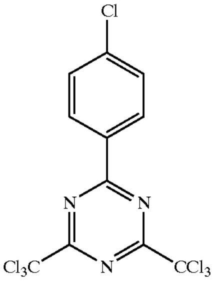
(PAG2-3)
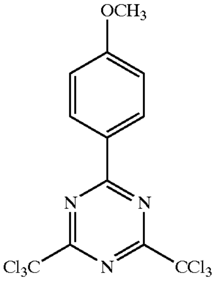
(PAG2-4)
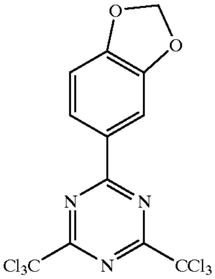
-continued
(PAG2-5)
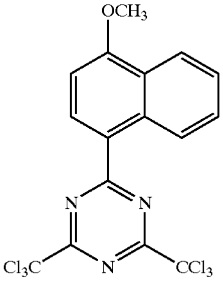
(PAG2-6)
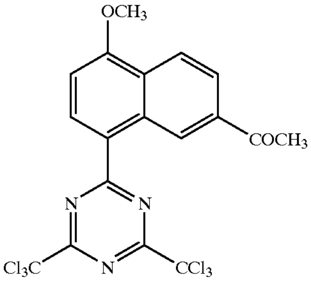
(PAG2-7)
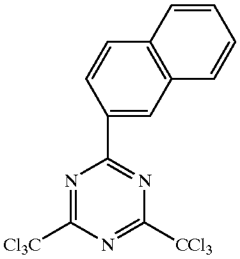
(PAG2-8)
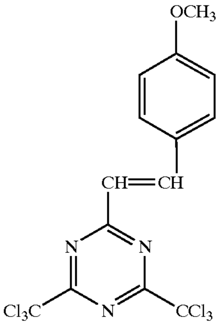
(PAG2-9)
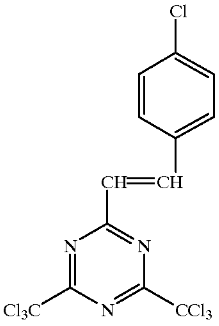

-continued (PAG2-10)

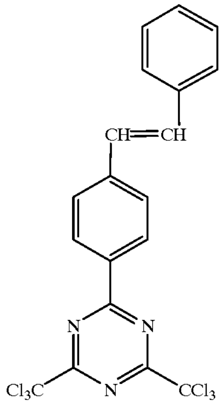

(2) Iodonium salt represented by formula (PAG3) shown below or sulfonium salt represented by formula (PAG4) shown below:

(PAG3)

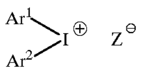

(PAG4)

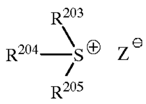

wherein $Ar^1$ and $Ar^2$ each independently represents a substituted or unsubstituted aryl group; $R^{203}$, $R^{204}$ and $R^{205}$ each independently represents a substituted or unsubstituted alkyl group or aryl group; and $Z^-$ represents a counter anion.

Examples of the counter anion represented by $Z^-$ include a perfluoroalkane sulfonate anion such as $BF_4^-$, $AsF_6^-$, $PF_6^-$, $SbF_6^-$, $SiF_6^{2-}$, $ClO_4^-$ and $CF_3SO_3^-$, an alkyl sulfonate anion such as camphor sulfonate anion, an aromatic sulfonate anion such as pentafluorobenzene sulfonate anion, benzene sulfonate anion and triisopropyl benzene sulfonate anion, a condensed polynuclear aromatic sulfonate anion such as naphthalene-1-sulfonate anion, anthraquinone sulfonate anion, and a sulfonic acid group-containing dye, however, the present invention should not be construed as being limited thereto. The anion moiety may further has a substituent.

Two of $R^{203}$, $R^{204}$ and $R^{205}$ or $Ar^1$ and $Ar^2$ may be combined through a single bond or a substituent.

Specific examples thereof include the following compounds, however, the present invention should not be construed as being limited thereto.

(PAG3-1)

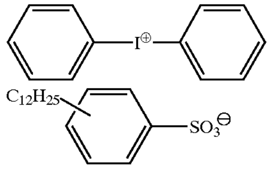

-continued (PAG3-2)

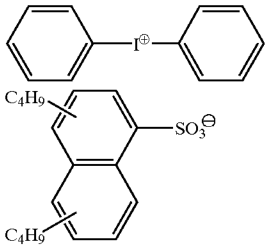

(PAG3-3)

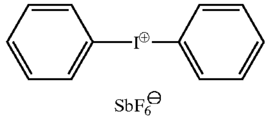

(PAG3-4)

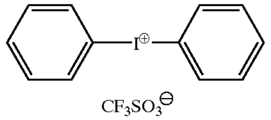

(PAG3-5)

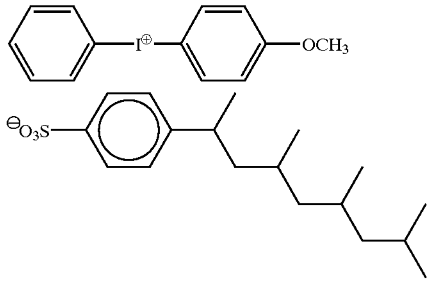

(PAG3-6)

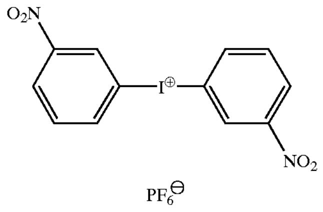

(PAG3-7)

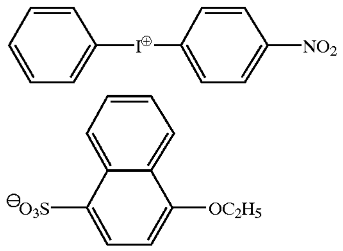

(PAG3-8)

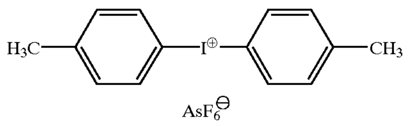

(PAG3-9)

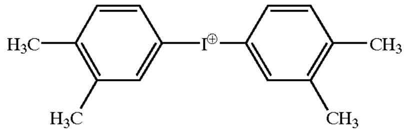

-continued
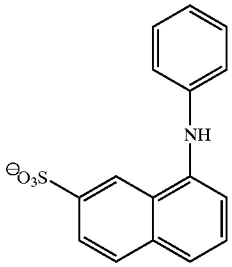
(PAG3-10)
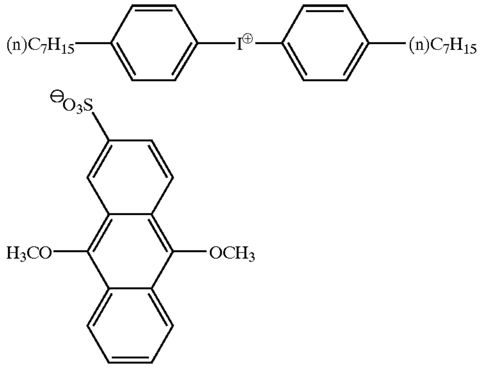
(PAG3-11)
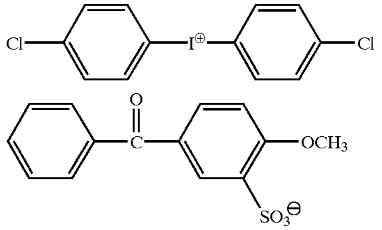
(PAG3-12)
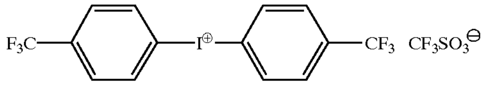
(PAG3-13)
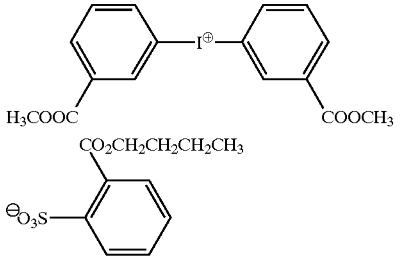
(PAG3-14)
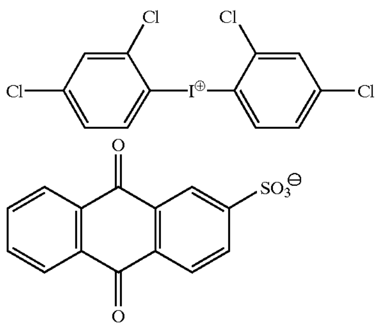
-continued
(PAG3-15)
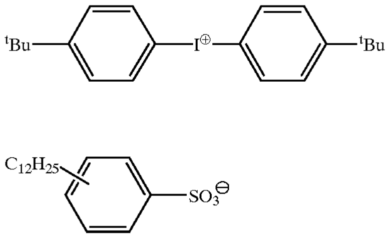
(PAG3-16)
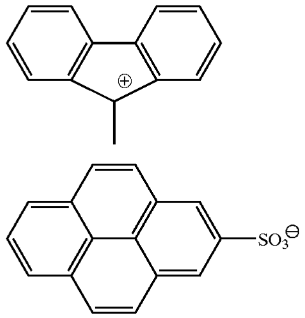
(PAG3-17)
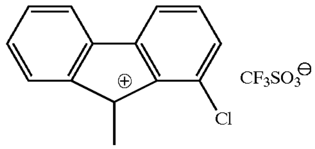
(PAG3-18)
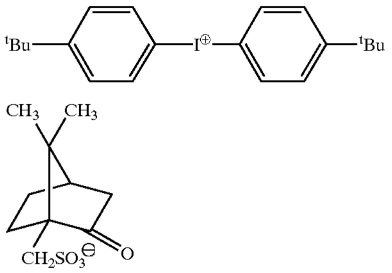
(PAG3-19)
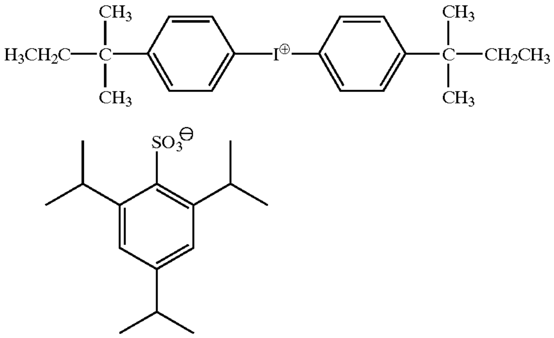
(PAG3-20)
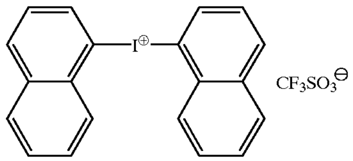

-continued
(PAG3-21)
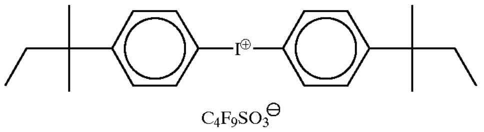
(PAG3-22)
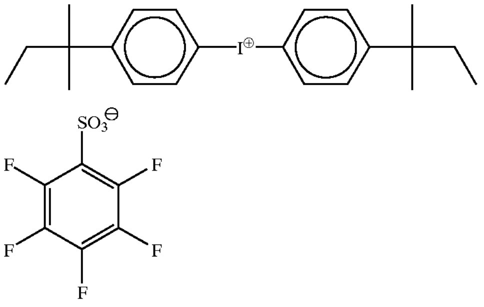
(PAG3-23)
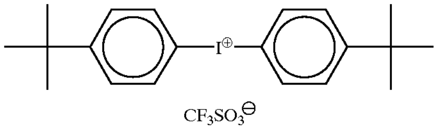
(PAG3-24)
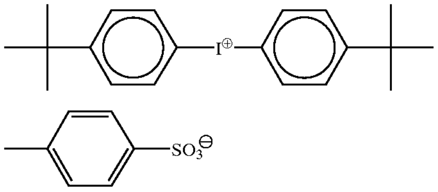
(PAG3-25)
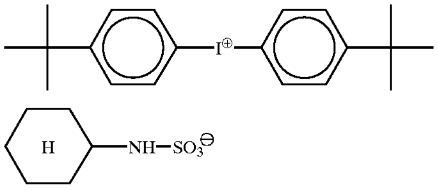
(PAG4-1)
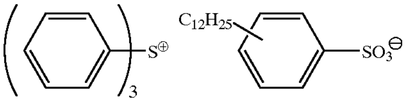
(PAG4-2)
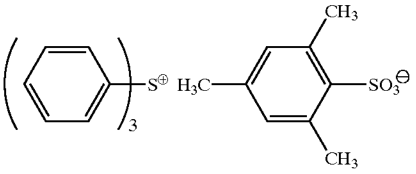
(PAG4-3)
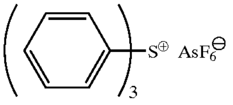
-continued
(PAG4-4)
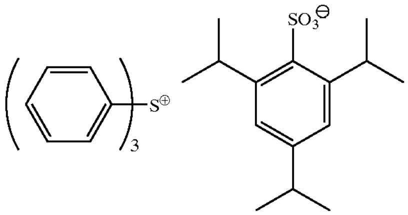
(PAG4-5)
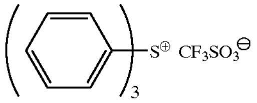
(PAG4-6)
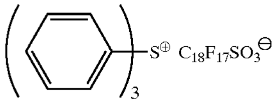
(PAG4-7)
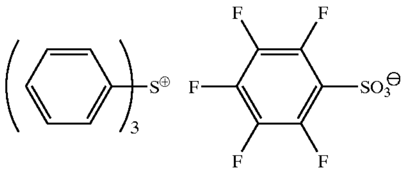
(PAG4-8)
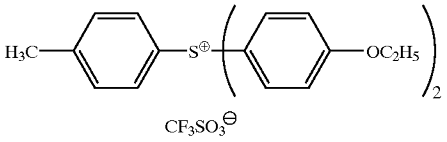
(PAG4-9)
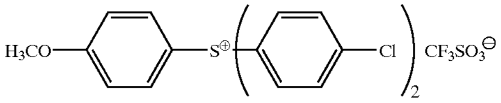
(PAG4-10)
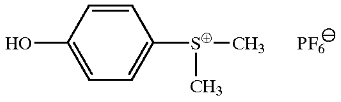
(PAG4-11)
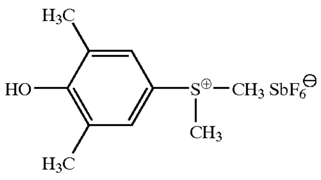
(PAG4-12)
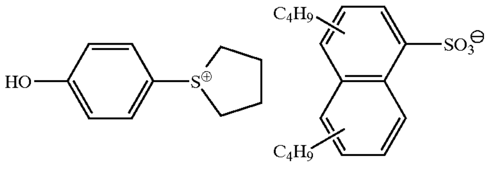

-continued
(PAG4-13)
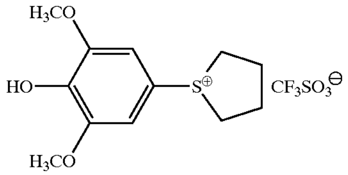
(PAG4-14)
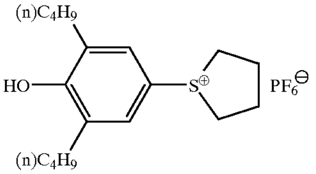
(PAG4-15)
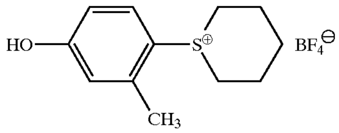
(PAG4-16)
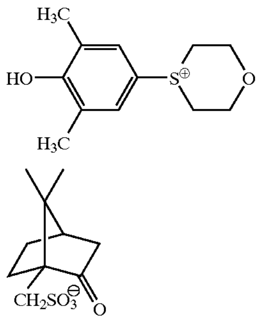
(PAG4-17)
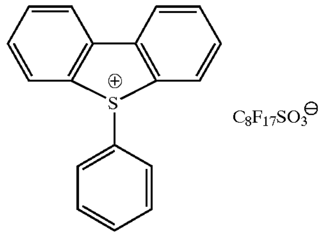
(PAG4-18)
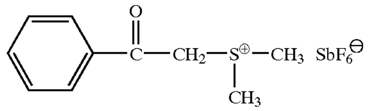
(PAG4-19)
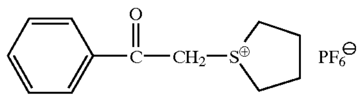
(PAG4-20)
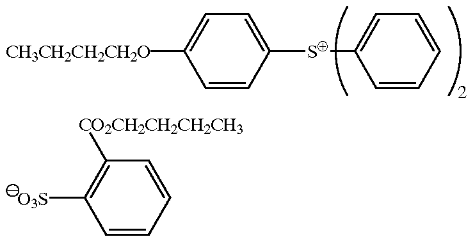
-continued
(PAG4-21)
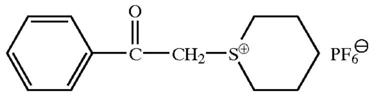
(PAG4-22)
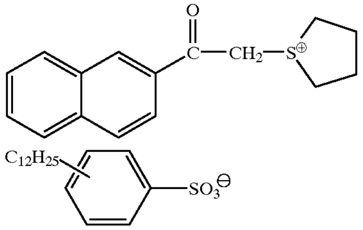
(PAG4-23)
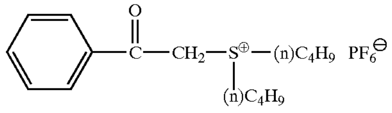
(PAG4-24)
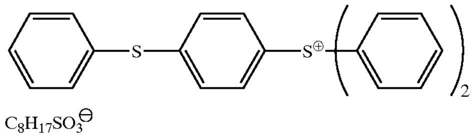
(PAG4-25)
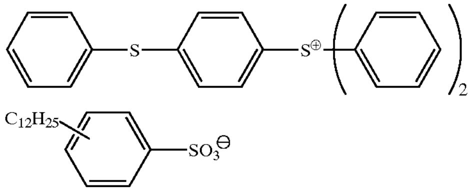
(PAG4-26)
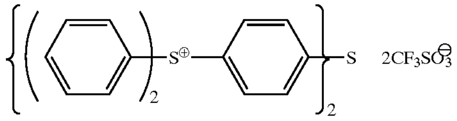
(PAG4-27)
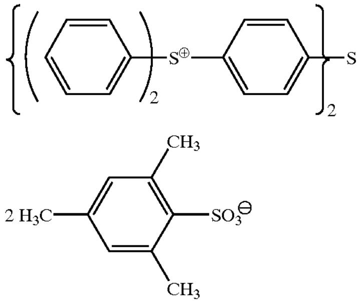
(PAG4-28)
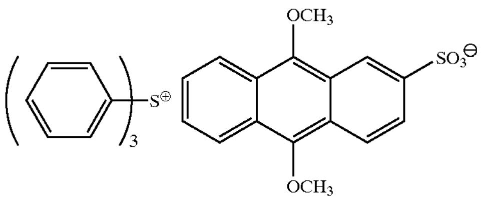

-continued (PAG4-29)

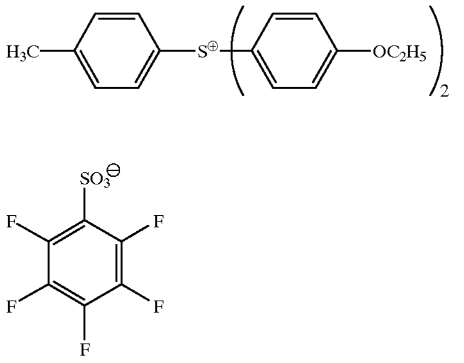

(PAG4-30)

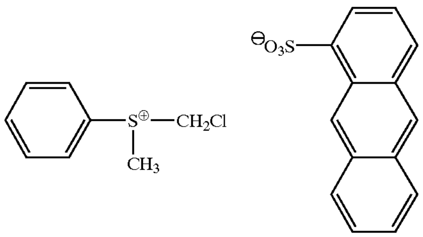

(PAG4-31)

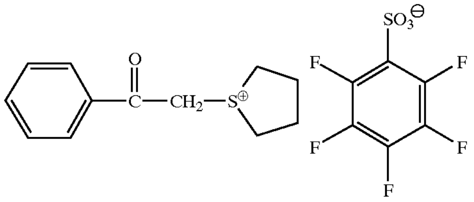

(PAG4-32)

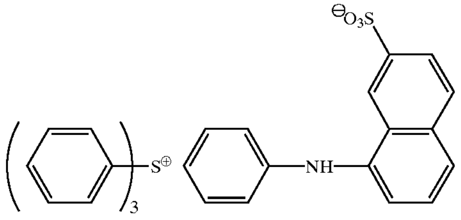

(PAG4-33)

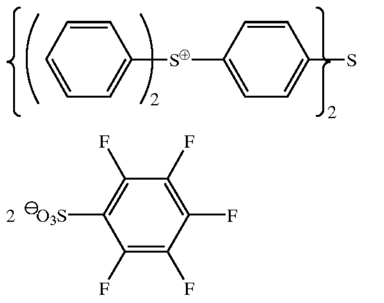

(PAG4-34)

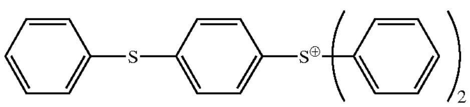

-continued

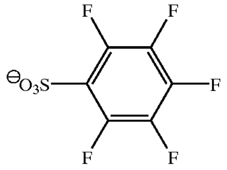

(PAG4-35)

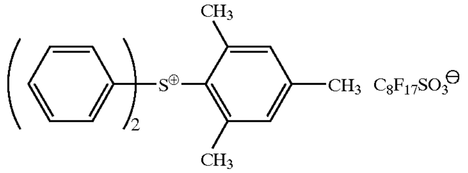

(PAG4-36)

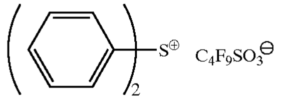

(PAG4-37)

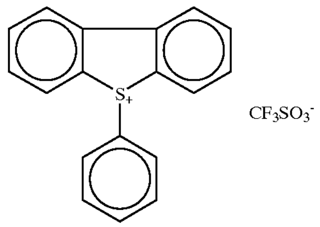

The onium salts represented by formulae (PAG3) and (PAG4) are known and can be synthesized by the methods described, for example, in J. W. Knapczyk et al., *J. Am. Chem. Soc.,* 91, 145 (1969), A. L. Maycok et al., *J. Org. Chem.,* 35, 2532 (1970), E. Goethas et al., *Bull. Soc. Chem. Belg.,* 73, 546 (1964), H. M. Leicester, *J. Ame. Chem. Soc.,* 51, 3587 (1929), J. V. Crivello et al., *J. Polym. Chem. Ed.,* 18, 2677 (1980) , U.S. Pat. Nos. 2,807,648 and 4,247,473, and JP-A-53-101331.

(3) Disulfone derivative represented by formula (PAG5) shown below or iminosulfonate derivative represented by formula (PAG6) shown below:

(PAG5)

$$Ar^3—SO_2—SO_2—Ar^4$$

(PAG6)

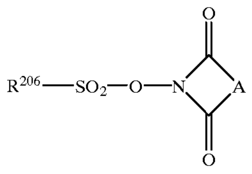

wherein $Ar^3$ and $Ar^4$ each independently represents a substituted or unsubstituted aryl group, $R^{206}$ represents a substituted or unsubstituted alkyl group or aryl group, and A represents a substituted or unsubstituted alkylene group, alkenylene group or arylene group.

Specific examples thereof include the following compounds, however, the present invention should not be construed as being limited thereto.

-continued
(PAG5-1)
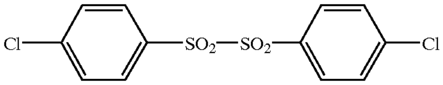
(PAG5-2)
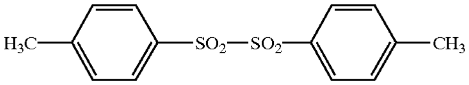
(PAG5-3)
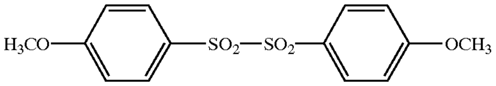
(PAG5-4)
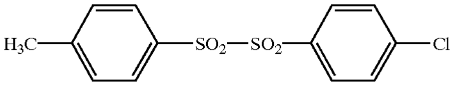
(PAG5-5)
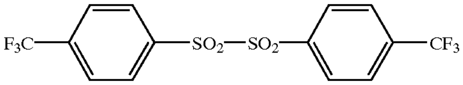
(PAG5-6)
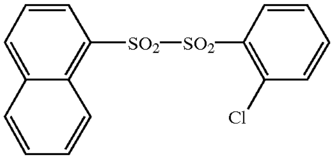
(PAG5-7)
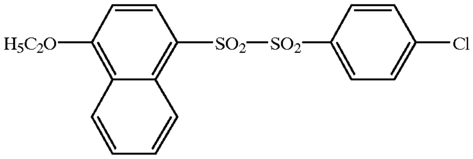
(PAG5-8)
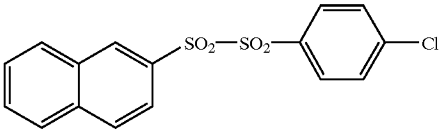
(PAG5-9)
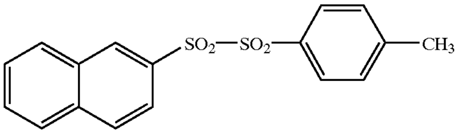
(PAG5-10)
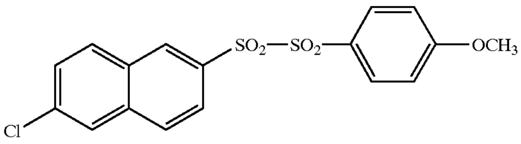
(PAG5-11)
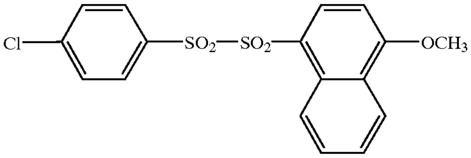
(PAG5-12)
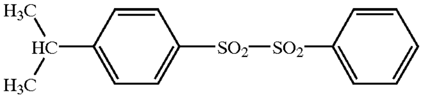
(PAG5-13)
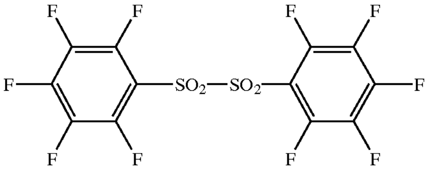
(PAG5-14)
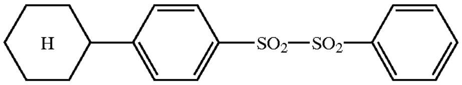
(PAG5-15)
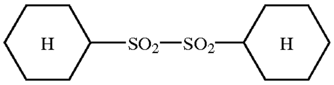
(PAG6-1)
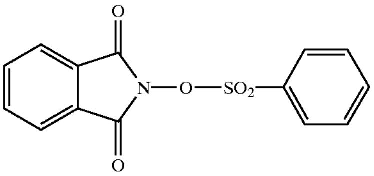
(PAG6-2)
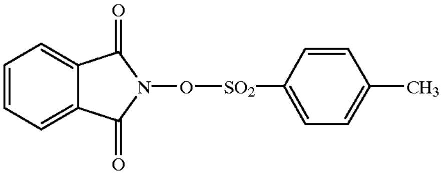
(PAG6-3)
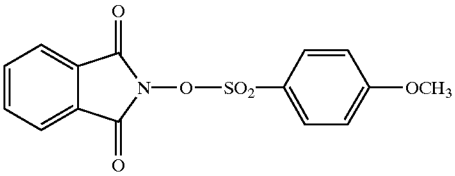
(PAG6-4)
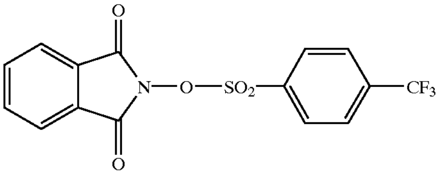

-continued
(PAG6-5)
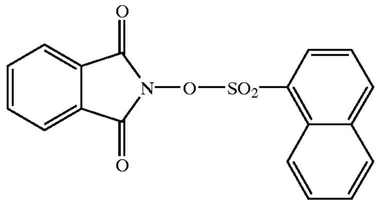
(PAG6-6)
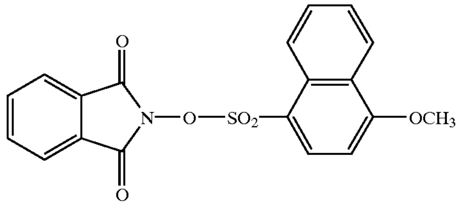
(PAG6-7)
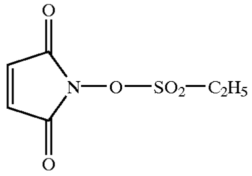
(PAG6-8)
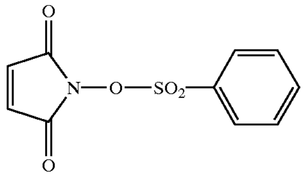
(PAG6-9)
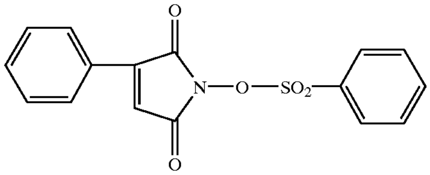
(PAG6-10)
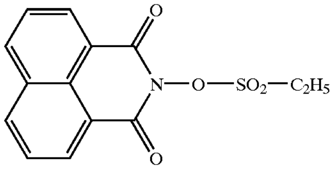
(PAG6-11)
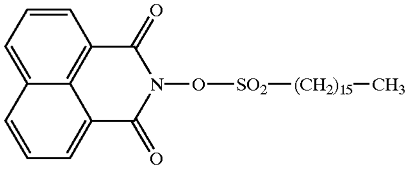
(PAG6-12)
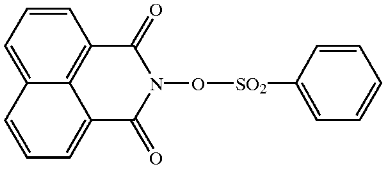
-continued
(PAG6-13)
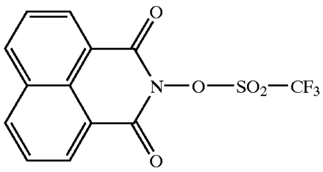
(PAG6-14)
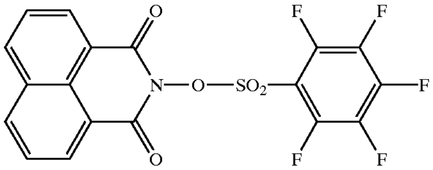
(PAG6-15)
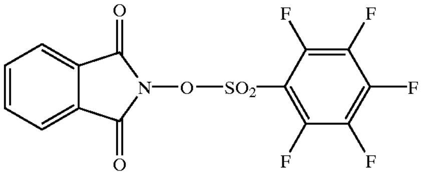
(PAG6-16)
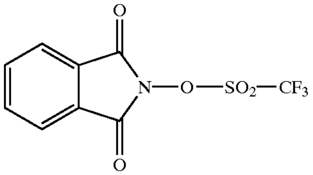
(PAG6-17)
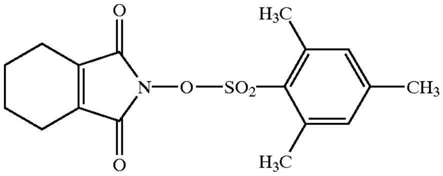
(PAG6-18)
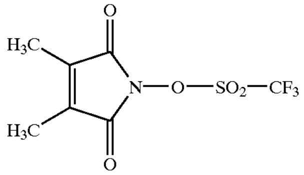
(PAG6-19)
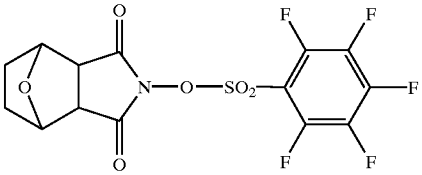

-continued (PAG6-20)

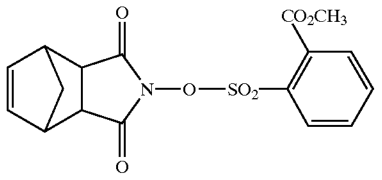

(4) Diazodisulfone derivative represented by formula (PAG7) shown below:

(PAG7)

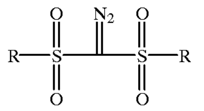

wherein R represents a straight-chain, branched chain or cyclic alkyl group or an aryl group which may be substituted.

Specific examples thereof include the following compounds, however, the present invention should not be construed as being limited thereto.

(PAG7-1)

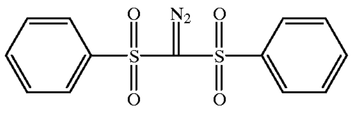

(PAG7-2)

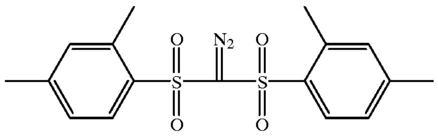

(PAG7-3)

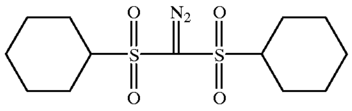

(PAG7-4)

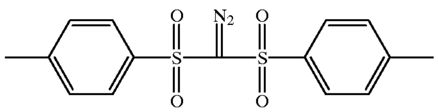

(PAG7-5)

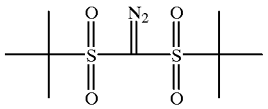

The amount of the photo-acid generator to be used is usually from 0.001 to 40% by weight, preferably from 0.01 to 20% by weight, more preferably from 0.1 to 5% by weight, based on the solid content of the positive photoresist composition. If the amount of the photo-acid generator is less than 0.001% by weight, sensitivity of the resist composition is reduced, whereas if the amount added exceeds 40% by weight, the resist exhibits too much light absorption, resulting in causing disadvantageous effects such as deterioration of profile or narrow process (particularly bake) margin.

<(B)Resin Increasing Solubility in an Alkaline Developing Solution by the Action of an Acid>

The resin (B) for use in the photoresist composition of the present invention is a resin which contains a repeating unit corresponding to hydroxystyrene and which decomposes by the action of an acid to increase solubility in an alkaline developing solution (hereinafter also referred to as an "alkali-soluble resin (B)" sometimes).

The hydroxystyrene can be any of o-, m- or p-hydroxystyrene and also may be partially hydrogenated. The hydroxystyrene may be substituted with other than the hydroxy group. Examples of the substituent include an alkyl group, an alkoxy group, an aralkyl group and an aryl group.

The resin having a group which decomposes with an acid and increases solubility in an alkaline developing solution (hereinafter also referred to as an "acid-decomposable group" sometimes) for use in the chemical amplification-type photoresist of the present invention is a resin having introduced an acid-decomposable group into the polymer main chain or side chain, or both the polymer main chain and side chain. A resin having an acid-decomposable group at the side chain is more preferred.

Preferred examples of the group decomposable with an acid include a group represented by —$COOA^0$ and a group represented by —O—$B^0$. Examples of groups containing these groups include a group represented by —$R^0$—$COOA^0$ or —Ar—O—$B^0$.

In the above formulae, $A^0$ represents —$C(R^{01})(R^{02})(R^{03})$, —$Si(R^{01})(R^{02})(R^{03})$ or —$C(R^{04})(R^{05})$—O—$R^{06}$, and $B^0$ represents —$A^0$ or —CO—O—$A^0$.

$R^{01}$, $R^{02}$, $R^{03}$, $R^{04}$ and $R^{05}$, which may be the same or different, each represents a hydrogen atom, an alkyl group, a cycloalkyl group, an alkenyl group or an aryl group, and $R^{06}$ represents an alkyl group or an aryl group. However, at least two of $R^{01}$ to $R^{03}$ are not hydrogen atoms; and two of $R^{01}$ to $R^{03}$ may be bonded to each other to form a ring, and two of $R^{04}$ to $R^{06}$ may be bonded to each other to form a ring $R^0$ represents an optionally substituted, aliphatic or aromatic hydrocarbon group having a valence of 2 or higher, and —Ar— represents an optionally substituted, monocyclic or polycyclic aromatic group having a valence of 2 or higher.

Preferred examples of the alkyl group include those having from 1 to 4 carbon atoms, such as methyl, ethyl, propyl, n-butyl, sec-butyl, and tent-butyl. Preferred examples of the cycloalkyl group include those having from 3 to 10 carbon atoms, such as cyclopropyl, cyclobutyl, cyclohexyl, and adamantly.

Preferred examples of the alkenyl group include those having from 2 to 4 carbon atoms, such as vinyl, propenyl, allyl, and butenyl. Preferred examples of the aryl group include those having from 6 to 14 carbon atoms, such as phenyl, xylyl, tolyl, cumenyl, naphthyl, and anthracenyl.

Examples of the substituent include a hydroxy group, a halogen atom (e.g., fluorine, chlorine, bromine and iodine), a nitro group, a cyano group, the foregoing alkyl group, an alkoxy group such as methoxy, ethoxy, hydroxyethoxy, propoxy, hydroxypropoxy, n-butoxy, isobutoxy, sec-butoxy and tert-butoxy, an alkoxycarbonyl group such as methoxycarbonyl and ethoxycarbonyl, an aralkyl group such as benzyl, phenethyl and cumyl, an aralkyloxy group, an acyl group such as formyl, acetyl, butyryl, benzoyl, cyanamyl and valeryl, an acyloxy group such as butyryloxy, the foregoing alkenyl group, an alkenyloxy group such as vinyloxy, propenyloxy, allyloxy and butenyloxy, the foregoing aryl group, an aryloxy group such as phenoxy, and an aryloxycarbonyl group such as benzoyloxy.

Examples of preferred acid-decomposable group include a silyl ether group, a cumyl ester group, an acetal group, a tetrahydropyranyl ether group, an enol ether group, an enol ester group, a tertiary alkyl ether group, a tertiary alkyl ester group, and a tertiary alkylcarbonate group. More preferred examples include a tertiary alkyl ester group, a tertiary alkylcarbonate group, a cumyl ester group, an acetal group, and a tetrahydropyranyl ether group. An acetal group is particularly preferred.

A parent resin in the case wherein the acid-decomposable groups are bonded as a side chain is an alkali-soluble resin having a repeating unit corresponding to the above-described hydroxystyrene and an —OH group or a —COOH group, preferably an —$R^0$—COOH group or an —Ar—OH group, at the side chain. The alkali-soluble resins described below can be exemplified as such parent resins, for instance.

In view of attaining a rectangular profile, an alkali-soluble resin which highly transmit a far ultraviolet ray or an excimer laser beam is preferred. Specifically, an alkali-soluble resin whose 1 μm-thick film has transmittance at 248 nm of from 20% to 90% is preferred.

Especially preferred alkali-soluble resins from such a standpoint are poly(o-, m-, or p-hydroxystyrene), copolymers of these hydroxystyrenes, hydrogenated poly (hydroxystyrene)s, halogen- or alkyl-substituted poly (hydroxystyrene)s, partially O-alkylated or O-acylated poly (hydroxystyrene)s, styrene/hydroxystyrene copolymers, α-methylstyrene/hydroxystyrene copolymers, and hydrogenated novolak resins.

The resin having the acid-decomposable group for use in the present invention can be obtained by reacting an alkali-soluble resin with a precursor of the acid-decomposable group or by copolymerizing a monomer for forming an alkali-soluble resin and having the acid-decomposable group bonded thereto with any of various monomers, as described, for example, in European Patent 254,853, JP-A-2-25850, JP-A-3-223860 and JP-A-4-251259.

Specific examples of the resin having the acid-decomposable group for use in the present invention are set forth below, but the present invention should not be construed as being limited thereto.

p-tert-Butoxystyrene/p-hydroxystyrene copolymer
p-(tert-Butoxycarbonyloxy)styrene/p-hydroxystyrene copolymer
p-(tert-Butoxycarbonylmethyloxy)styrene/p-hydroxystyrene copolymer
4-(tert-Butoxycarbonylmethyloxy)-3-methylstyrene/4-hydroxy-3-methylstyrene copolymer
p-(tert-Butoxycarbonylmethyloxy)styrene/p-hydroxystyrene (10% hydrogenated) copolymer
m-(tert-Butoxycarbonylmethyloxy)styrene/m-hydroxystyrene copolymer
o-(tert-Butoxycarbonylmethyloxy)styrene/o-hydroxystyrene copolymer
p-(Cumyloxycarbonylmethyloxy)styrene/p-hydroxystyrene copolymer
p-(tert-Butoxycarbonylmethyloxy)styrene/p-hydroxystyrene/styrene copolymer
p-tert-Butoxystyrene/p-hydroxystyrene/fumaronitrile copolymer
p-Hydroxystyrene/tert-butyl methacrylate copolymer
Styrene/p-hydroxystyrene/ tert-buty methacrylate copolymer
p-H ydroxystyrene/ tert-butyl acrylate copolymer
Styrene/p-hydroxystyrene/tert-butyl acrylate copolymer
p-(tert-Butoxycarbonylmethyloxy)styrene/p-hydroxystyrene/N-methylmaleimide copolymer
p-Hydroxystyrene/tert-butyl acrylate/p-acetoxystyrene copolymer
p-Hydroxystyrene/tert-butyl acrylate/p-(tert-butoxycarbonyloxy)styrene copolymer
p-Hydroxystyrene/tert-butyl acrylate/p-(tert-butoxycarbonylmethyloxy)styrene copolymer

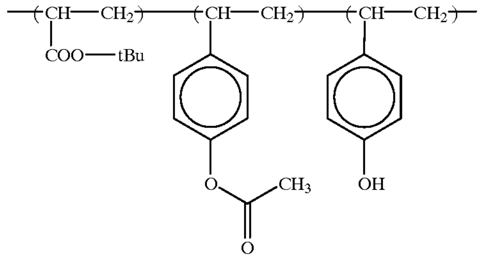

Of the resins (B) having the acid-decomposable group, resins containing a repeating unit represented by formula (IV) and a repeating unit represented by formula (V) described above are preferred since they exhibit the effect of the present invention remarkably.

The straight-chain, branched chain or cyclic alkyl group for L and Z in formula (IV) includes that having from 1 to 20 carbon atoms, for example, methyl ethyl, propyl, isopropyl, n-butyl, isobutyl, tert-butyl, pentyl, cyclopentyl, hexyl, cyclohexyl, octyl and dodecyl.

Preferred examples of the substituent for the alkyl group include an alkyl group, an alkoxy group, a hydroxy group, a halogen atom, a nitro group, an acyl group, an acylamino group, a sulfonylamino group, an alkylthio group, an arylthio group and aralkylthio group. Specific examples of the substituted alkyl group include cyclohexylethyl, alkylcarbonyloxymethyl, alkylcarbonyloxyethyl, arylcarbonyloxyethyl, alkylcarbonyloxymethyl, alkyloxymethyl, aryloxymethyl, aralkyloxymethyl, alkyloxyethyl, aryloxyethyl, aralkyloxyethyl, alkylthiomethyl, arylthiomethyl, aralkylthiomethyl, alkylthioethyl, arylthioethyl and aralkylthioethyl. The alkyl group contained in these groups is not particularly limited and includes any of straight-chain, branched chain or cyclic alkyl group. Examples of such alkyl-substituted group include, for example, cyclohexylcarbonyloxyethyl, tert-butylcyclohexylcarbonyloxyethyl and n-butyl cyclohexylcarbonyloxyethyl. The aryl group contained in these groups is also not particularly limited and may be substituted. Examples of such aryl-substituted group include, for example, phenyloxyethyl and cyclohexylphenyloxyethyl. The aralkyl group contained in these groups is also not particularly limited. Examples of such aralkyl-substituted group include, for example, benzylcarbonyloxyethyl.

The aralkyl group for L and Z in formula (IV) includes that having from 7 to 15 carbon atoms, for example, a substituted or unsubstituted benzyl group and a substituted or unsubstituted phenethyl group. Preferred examples of the substituent for the aralkyl group include an alkoxy group, a hydroxy group, a halogen atom, a nitro group, an acyl group, an acylamino group, a sulfonylamino group, an alkylthio group, an arylthio group and aralkylthio group. Specific examples of the substituted aralkyl group include alkoxybenzyl, hydroxybenzyl and phenylthiophenetyl.

To introduce a bulky group such as a phenyl group or a cyclohexyl group into the terminal of the substituted alkyl group or substituted aralkyl group is advantageous to further improvement in the line edge roughness.

The 5-membered or 6-membered ring formed by being combined with Z and L each other includes, for example, a tetrahydropyran ring and a tetrahydrofuran ring.

A molar ratio of the repeating unit represented by formula (IV)/the repeating unit represented by formula (V) present in the resin is preferably from 1/99 to 60/40, more preferably from 5/95 to 50/50 and still more preferably from 10/90 to 40/60.

The resin containing the repeating unit represented by formula (IV) and the repeating unit represented by formula (V) described above may further contain a repeating unit derived from other monomer.

Examples of the other monomer include a hydrogenated hydroxystyrene; a halogen-, alkoxy- or alkyl-substituted hydroxystyrene; styrene; a halogen-, alkoxy- acyloxy- or alkyl-substituted styrene; maleic anhydride; an acrylic acid derivative; a methacrylic acid derivative; and an N-substituted maleimide, but the present invention should not be construed as being limited thereto.

A molar ratio of the repeating unit represented by formula (IV) and the repeating unit represented by formula (V)/the repeating unit of other monomer, i.e., [(IV)+(V)]/[other monomer]present in the resin is ordinarily from 100/0 to 50/50, preferably from 100/0 to 60/40 and more preferably from 100/0 to 70/30.

Specific examples of the resin containing the repeating unit represented by formula (IV) and the repeating unit represented by formula (V) are set forth below, bur the present invention should not be construed as being limited thereto.

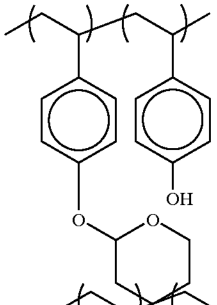
(IV-1)

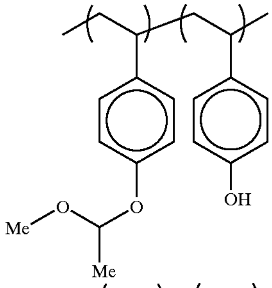
(IV-2)

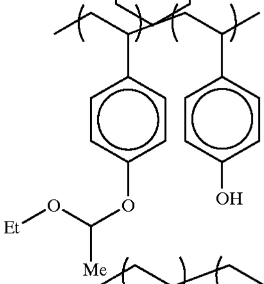
(IV-3)

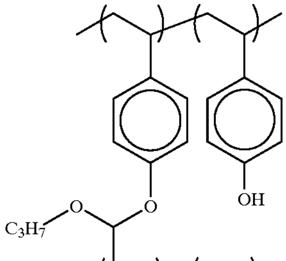
(IV-4)

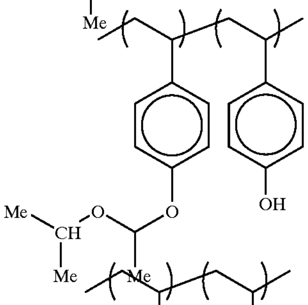
(IV-5)

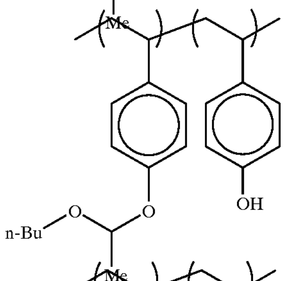
(IV-6)

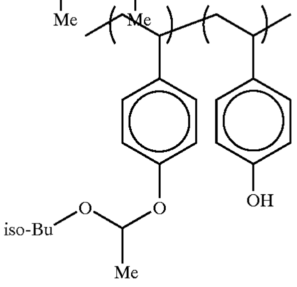
(IV-7)

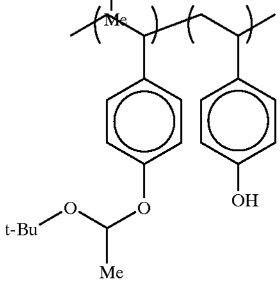
(IV-8)

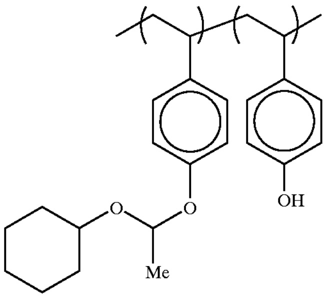
(IV-9)

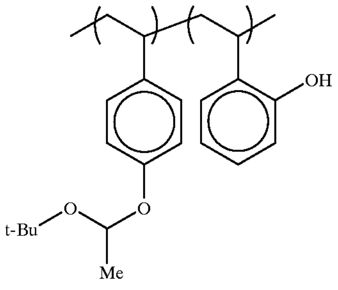
(IV-10)

-continued
(IV-11)
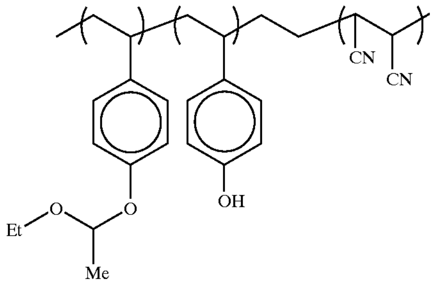
(IV-12)
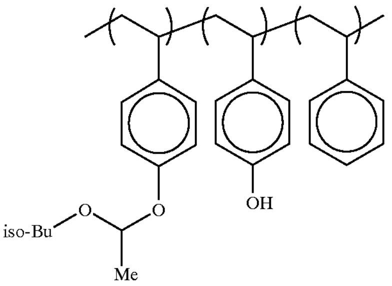
(IV-13)
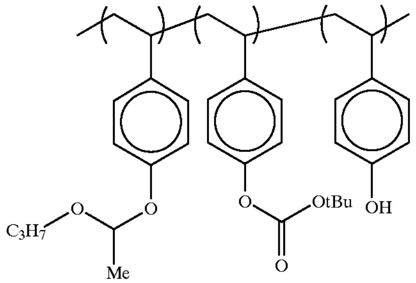
(IV-14)
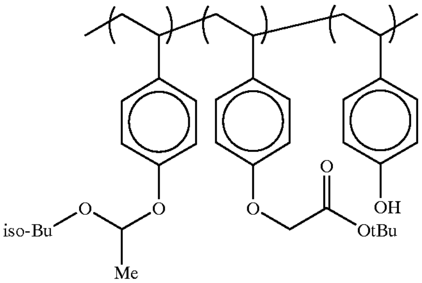
(IV-15)
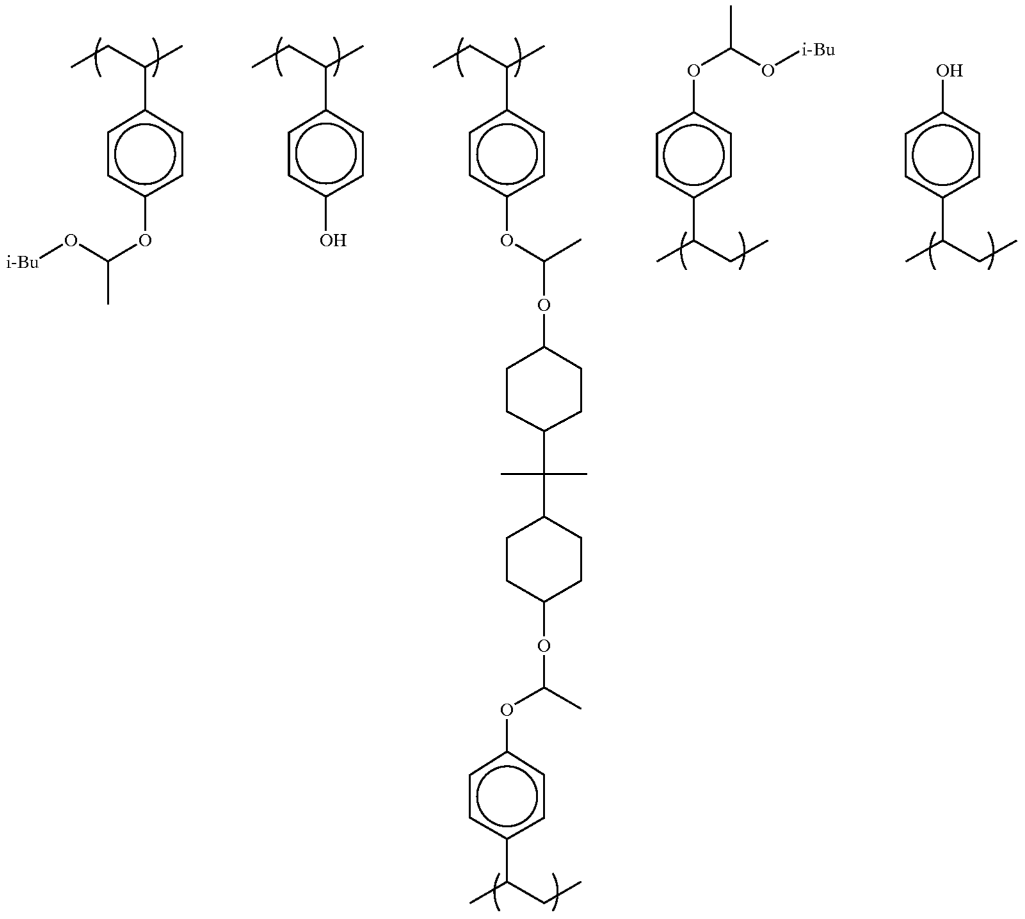

-continued
(IV-16)
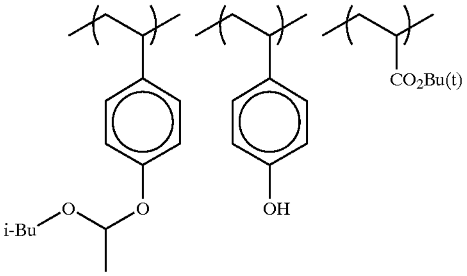
(IV-17)
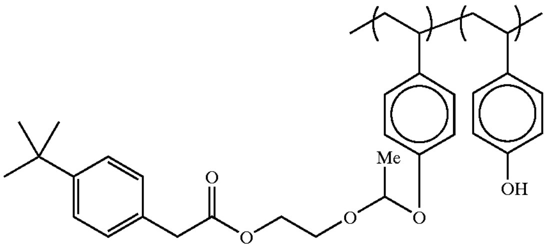
(IV-18)
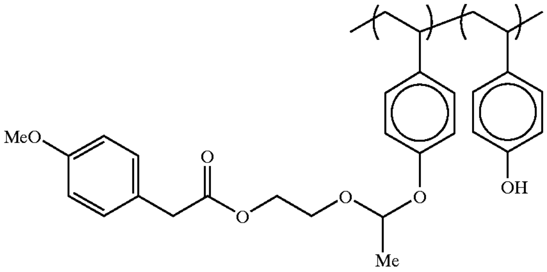
(IV-19)
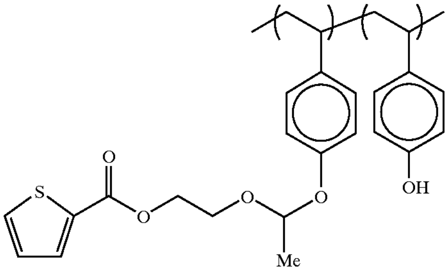
(IV-20)
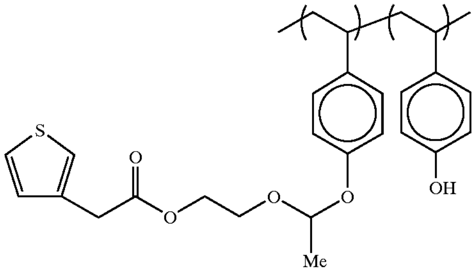
(IV-21)
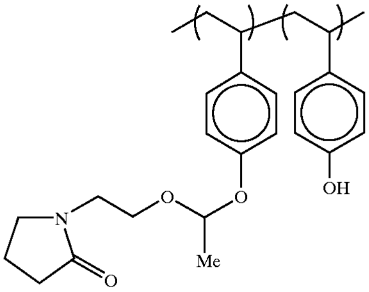
(IV-22)
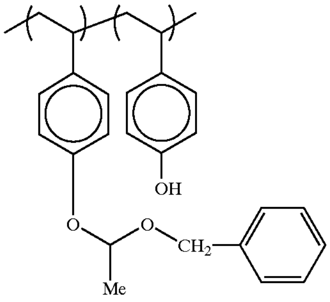
(IV-23)
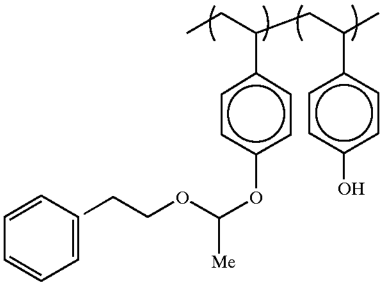
(IV-24)
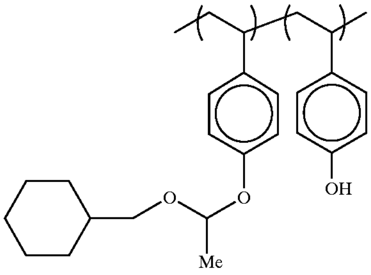
(IV-25)
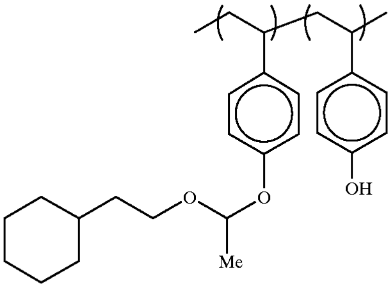

-continued
(IV-26)
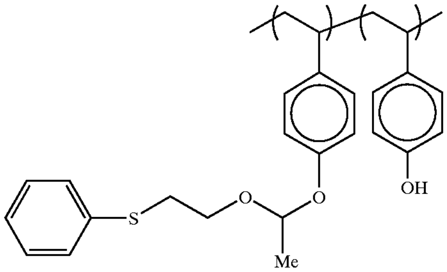
(IV-27)
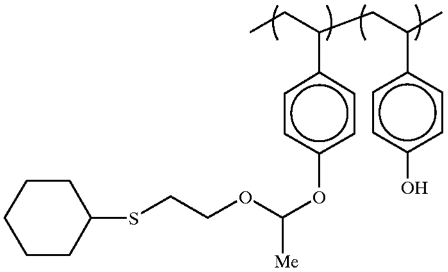
(IV-28)
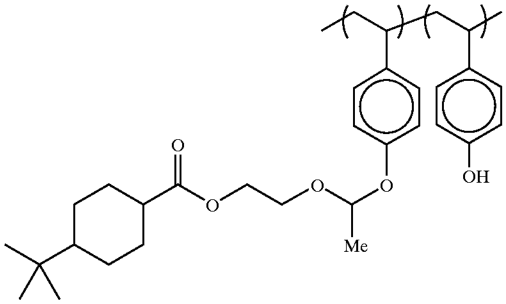
(IV-29)
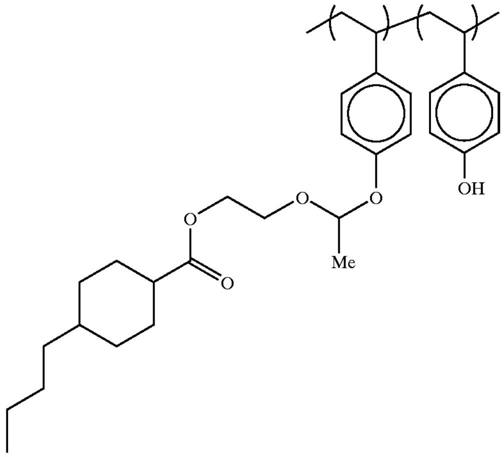
(IV-30)
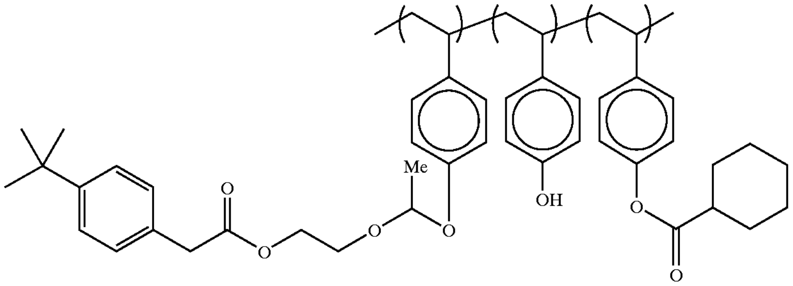
(IV-31)
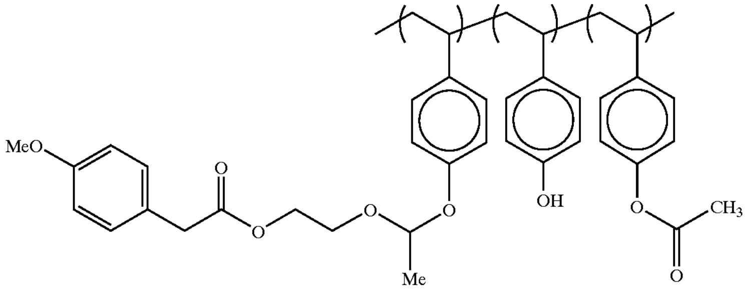
(IV-32)
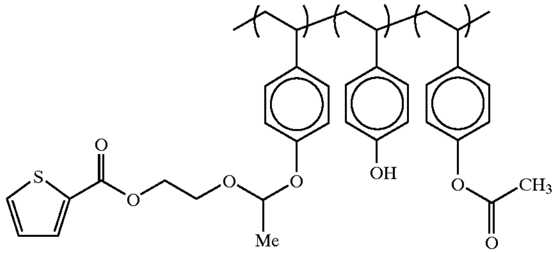
(IV-33)
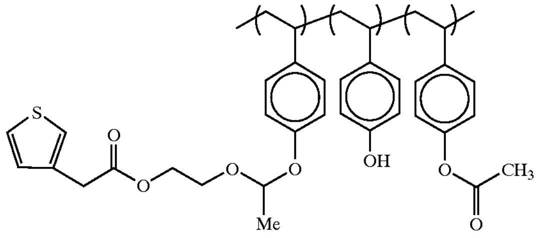

-continued
(IV-34)
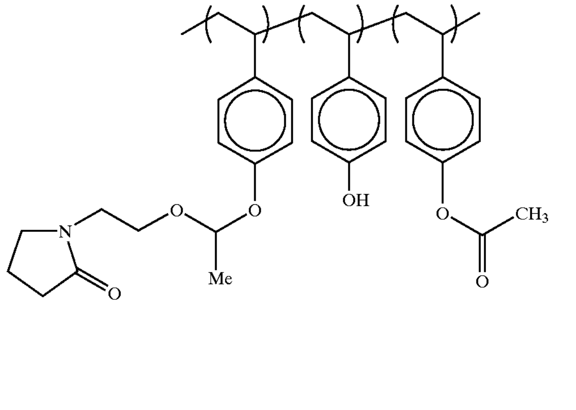
(IV-35)
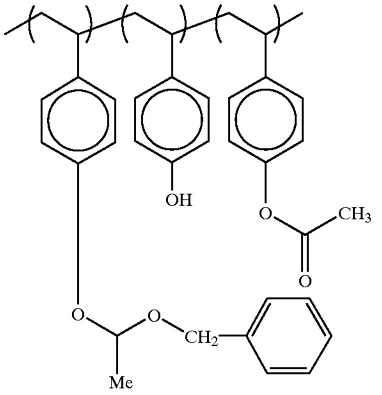
(IV-36)
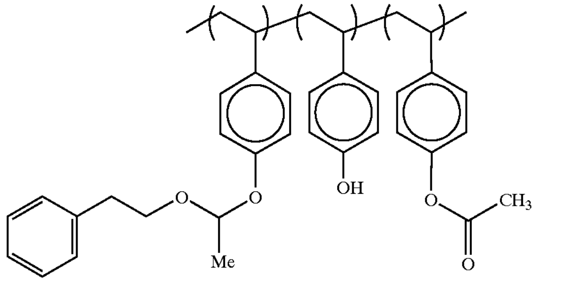
(IV-37)
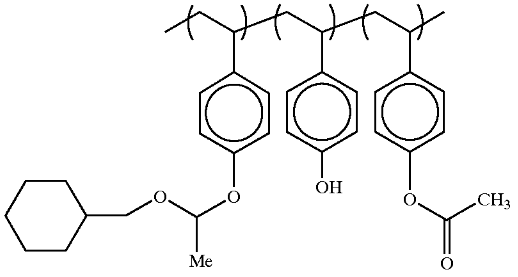
(IV-38)
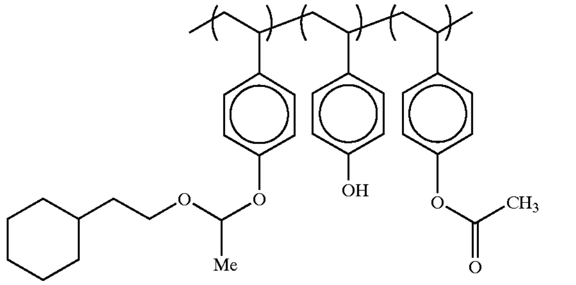
(IV-39)
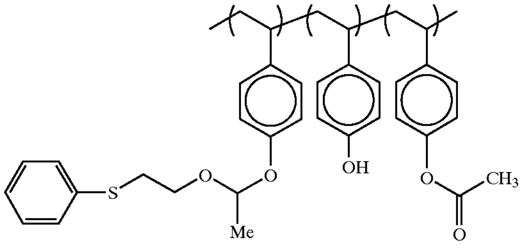
(IV-40)
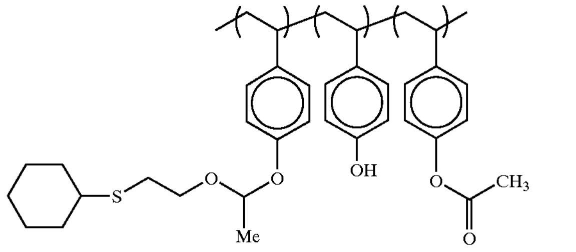
(IV-41)
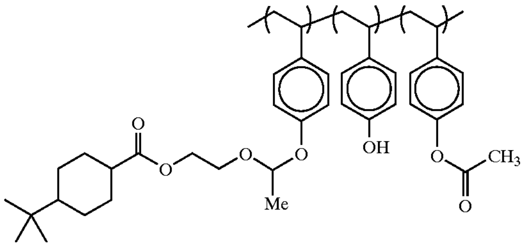

-continued (IV-42)

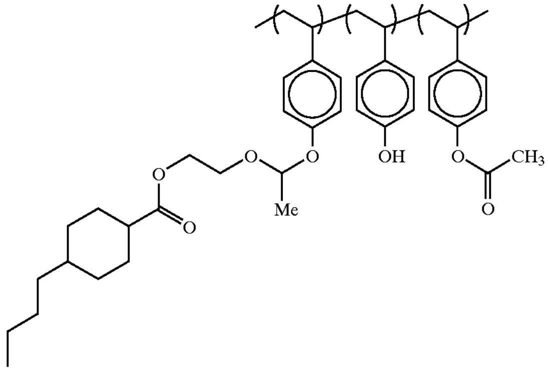

(IV-43)

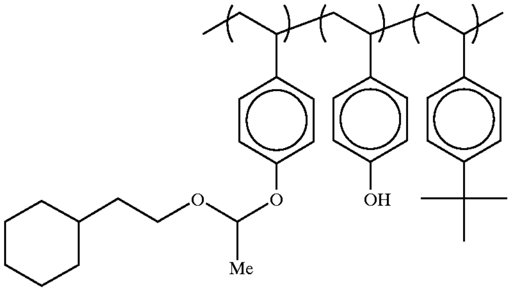

(IV-44)

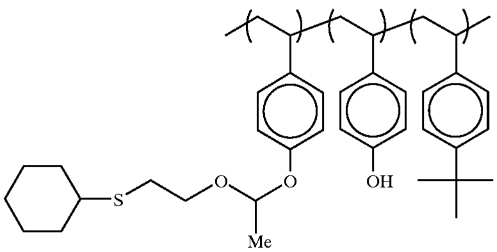

(IV-45)

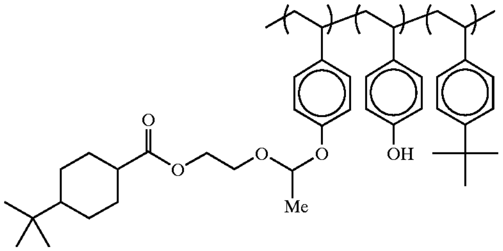

(IV-46)

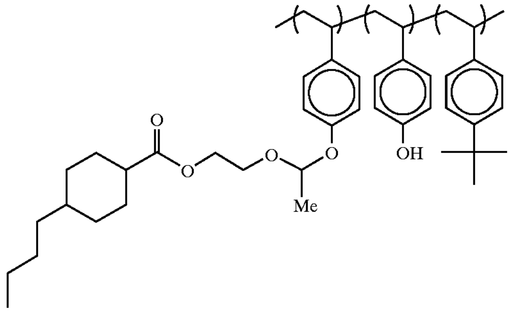

(IV-47)

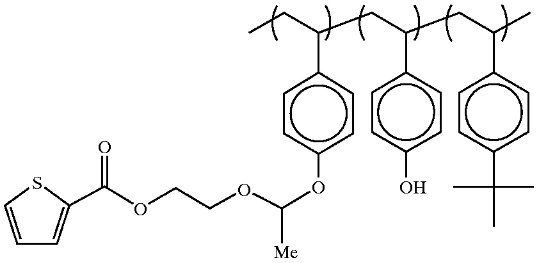

In the above-described formulae, Me represents a methyl group, Et represents an ethyl group, n-Bu represents a n-butyl group, iso-Bu represents an isobutyl group and t-Bu represents a tert-butyl group.

In case of using an acetal group as the acid-decomposable group, crosslinking portions connected with polyfunctional acetal groups may be introduced into the polymer main chain by means of adding a polyhydroxy compound in the preparation step thereof in order to control an alkali-soluble rate and to improve heat-resistance. The amount of the polyhydroxy compound added is preferably from 0.01 to 5 mol %, more preferably from 0.05 to 4 mol %, based on the content of hydroxy group in the resin. The polyhydroxy compound to be used have phenolic hydroxy groups or alcoholic hydroxy groups in an amount of 2 to 6, preferably from 2 to 4 and more preferably 2 or 3.

Specific examples of the polyhydroxy compound are set forth below, bur the present invention should not be construed as being limited thereto.

$HO-(CH_2)_n-OH$ n = 2 ~ 8

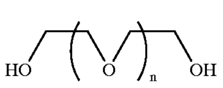

n = 1 ~ 5

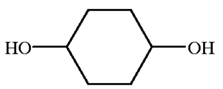

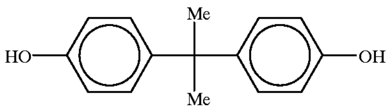

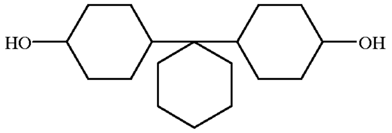

-continued

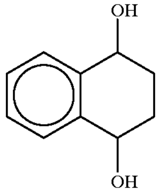

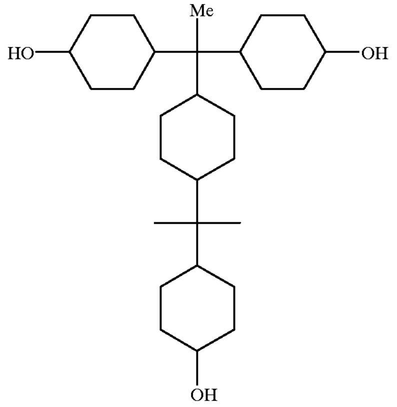

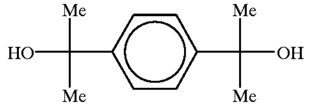

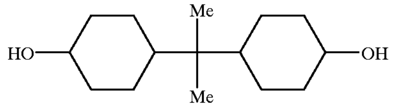

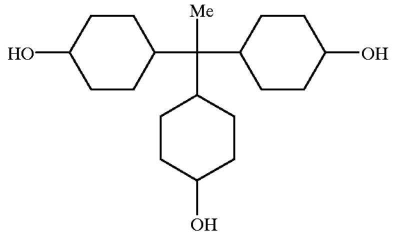

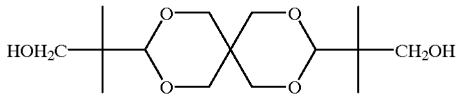

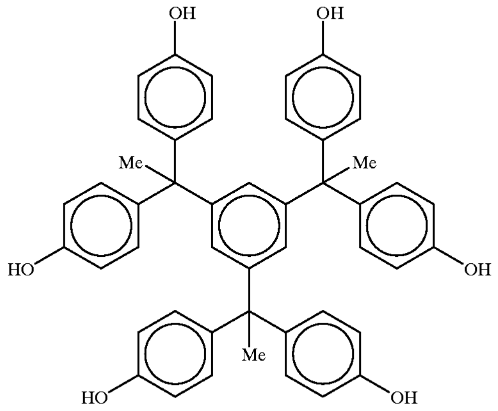

The content of repeating unit containing the acid-decomposable group in the resin (B) of the present invention is preferably from 5 to 50 mol %, more preferably from 5 to 40 mol %, based on the total repeating units.

The content of repeating unit corresponding to hydroxystyrene in the resin (B) of the present invention is preferably from 5 to 95 mol %, more preferably from 10 to 85 mol %, based on the total repeating units.

The weight average molecular weight (Mw) of the resin having the acid-decomposable group is preferably in a range of from 2,000 to 300,000. If it is less than 2,000, decrease in a film thickness of the unexposed area during development is large and on the other hand, if it exceeds 300,000, a dissolution rate of the resin per se to alkali decreases, resulting in lowering sensitivity. The weight average molecular weight is determined by gel permeation chromatography and calculated in terms of polystyrene.

Two or more of the resins (B) having the acid-decomposable group may be used in the photosensitive composition of the present invention. The amount of resins (B) is ordinarily from 40 to 99% by weight, preferably from 60 to 98% by weight, based on the total weight (excluding solvent) of the photosensitive composition.

The composition of the present invention contains (C)(1) at least one solvent selected from the group consisting of propylene glycol monomethyl ether acetate and propylene glycol monomethyl ether propionate (hereinafter also referred to as solvent (1) sometimes) and (2) at least one solvent selected from the group consisting of propylene glycol monomethyl ether and ethoxyethyl propionate (hereinafter also referred to as solvent (2) sometimes), in addition to the photo-acid generator (A) and the alkali-soluble resin (B).

The photoresist composition of the present invention may further contain (3) at least one solvent selected from the group consisting of γ-butyrolactone, ethylene carbonate and propylene carbonate (hereinafter also referred to as solvent (3) sometimes). Preservation stability of the resist solution and micro grain are further improved in addition to the improvement in coating uniformity.

A weight ratio of the solvent (1) to the solvent (2) used, i.e., [(1)/(2)] is ordinarily 90/10 to 15/85, preferably from 80/20 to 20/80 and more preferably from 70/30 to 25/75.

A weight ratio of the solvent (3) used is ordinarily from 1 to 20% by weight, preferably from 3 to 15% by weight, based on the total amount of the solvents used.

Examples of preferred combination of the solvents for use in the present invention include:

Propylene glycol monomethyl ether acetate/propylene glycol monomethyl ether,

Propylene glycol monomethyl ether acetate/ethoxyethyl propionate,

Propylene glycol monomethyl ether propionata/propylene glycol monomethyl ether,

Propylene glycol monomethyl ether propionata/ethoxyethyl propionate,

Propylene glycol monomethyl ether acetate/propylene glycol monomethyl ether/γ-butyrolactone, Propylene glycol monomethyl ether acetate/propylene glycol monomethyl ether/ethylene carbonate, and Propylene glycol monomethyl ether acetate/propylene glycol monomethyl ether/propylene carbonate.

A content of the solid including the photo-acid generator (A) and the alkali-soluble resin (B) in the solvent (C) is preferably from 3 to 40% by weight, more preferably from 5 to 30% by weight and still more preferably from 7 to 20% by weight.

The positive photoresist composition of the present invention may further contain, if desired, an acid decomposable dissolution preventing compound, a dye, a plasticizer, a surface active agent, a photosensitizer, an organic basic compound, a compound which accelerates solubility in a developing solution, and the like.

The positive photoresist composition of the present invention may contain a fluorine-base and/or silicon-base surface active agent.

The positive photoresist composition according to the present invention may contain either a fluorine-base surface active agent, a silicon-base surface active agent or both of the fluorine-base surface active agent and the silicon-base surface active agent.

Examples of the fluorine-base and/or silicon-base surface active agent include those described, for example, in JP-A-62-36663, JP-A-61-226746, JP-A-61-226745, JP-A-62-170950, JP-A-63-34540, JP-A-7-230165, JP-A-8-62834, JP-A-9-54432 and JP-A-9-5988. Commercially available surface active agents are also employed as they are.

Examples of commercially available surface active agents which can be used include fluorine-base surface active agents and silicon-base surface active agents, for example, Eftop EF301 and EF303 (manufactured by Shin Akita Chemical Co., Ltd.), Florad FC430 and FC431 (manufactured by Sumitomo 3M Ltd.), Megafac F171, F173, F176, F189 and R08 (manufactured by Dainippon Ink and Chemicals, Inc.), Surflon S-382, SC101, SC102, SC103, SC104, SC105 and SC106 (manufactured by Asahi Glass Company, Ltd.), and Troysol S-366 (manufactured by Troy Chemical Co., Ltd.). Also, polysiloxane polymer KP-341 (manufactured by Shin-Etsu Chemical Co., Ltd.) is employed as the silicon-base surface active agent.

The amount of such a surface active agent added is ordinarily from 0.01 to 2% by weight, preferably from 0.01 to 1% by weight, based on the solid content in the photoresist composition of the present invention. The surface active agents may be used individually or in combination of two or more thereof.

In the present invention, a surface active agent other than the fluorine-base and/or silicon-base surface active agent described above may be used. Specific examples thereof include a nonionic surface active agent, for example, a polyoxyethylene alkyl ether such as polyoxyethylene lauryl ether, polyoxyethylene stearyl ether, polyoxyethylene cetyl ether and polyoxyethylene oleyl ether, a polyoxyethylene alkylaryl ether such as polyoxyethylene octylphenol ether and polyoxyethylene nonylphenol ether, a polyoxyethylene/polyoxypropylene block copolymer, a sorbitan fatty acid ester such as sorbitan monolaurate, sorbitan monopalmitate, sorbitan monostearate, sorbitan monooleate, sorbitan trioleate and sorbitan tristearate, and a polyoxyethylene sorbitan fatty acid ester such as polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate. The amount of the surface active agent other than the fluorine-base and silicon-base surface active agent used is ordinarily 2 parts by weight or less, preferably 1 part by weight or less, based on 100 parts by weight of the solid content of the photoresist composition of the present invention.

The organic basic compound which can be used in the present invention is preferably a nitrogen-containing basic compound having the structure shown below.

(A)

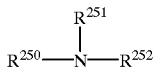

wherein $R^{250}$, $R^{251}$ and $R^{252}$, which may be the same or different, each represents a hydrogen atom, an alkyl group having from 1 to 6 carbon atoms, an aminoalkyl group having from 1 to 6 carbon atoms, a hydroxyalkyl group having from 1 to 6 carbon atoms or a substituted or unsubstituted aryl group having from 6 to 20 carbons atoms, or $R^{251}$ and $R^{252}$ may be combined with each other to form a ring;

(B)

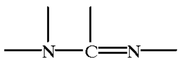

(C)

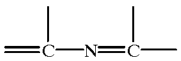

(D)

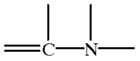

(E)

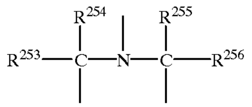

wherein $R^{253}$, $R^{254}$, $R^{255}$ and $R^{256}$, which may be the same or different, each represents an alkyl group having from 1 to 6 carbon atoms.

More preferred organic basic compound is a nitrogen-containing cyclic compound and a nitrogen-containing basic compound having two or more nitrogen atoms of different chemical environment in its molecule.

The nitrogen-containing cyclic compound preferably has a polycyclic structure. Specific examples of preferred nitrogen-containing polycyclic compound include those represented by formula (VI) shown below.

(VI)

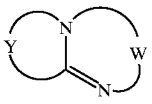

wherein Y and W, which may be the same or different, each represents a straight-chain, branched or cyclic alkylene group which may contain a hetero atom or may be substituted. Examples of the hetero atom includes a nitrogen atom, a sulfur atom and an oxygen atom. The alkylene group preferably has from 2 to 10 carbon atoms, more preferably from 2 to 5 carbon atoms. Examples of the substituents for the alkylene group include an alkyl group having from 1 to 6 carbon atoms, an aryl group, an alkenyl group, a halogen atom and a halogen-substituted alkyl group. Specific examples of the compound represented by formula (VI) are set forth below.

(VI-1)

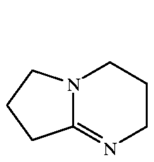

(VI-2)

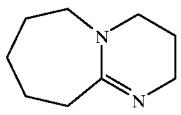

-continued (VI-3)

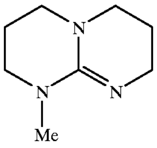

(VI-4)

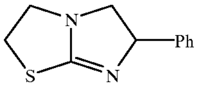

(VI-5)

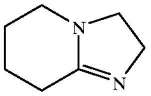

(VI-6)

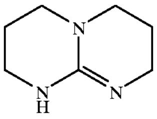

(VI-7)

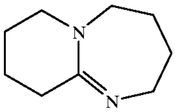

(VI-8)

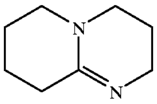

Particularly preferred examples of the compound represented by formula (VI) are 1,8-diazabicyclo-[5.4.0]undec-7-ene and 1,5-diazabicyclo[4.3.0]non-5-ene.

Of the nitrogen-containing basic compounds having two or more nitrogen atoms of different chemical environment in their molecule, those particularly preferred include a compound containing both a substituted or unsubstituted amino group and a ring structure having a nitrogen atom and a compound having an alkylamino group. Preferred specific examples thereof include a substituted or unsubstituted guanidine, a substituted or unsubstituted aminopyridine, a substituted or unsubstituted aminoalkylpyridine, a substituted or unsubstituted aminopyrrolidine, a substituted or unsubstituted indazole, a substituted or unsubstituted pyrazole, a substituted or unsubstituted pyrazine, a substituted or unsubstituted pyrimidine, a substituted or unsubstituted purine, a substituted or unsubstituted imidazoline, a substituted or unsubstituted pyrazoline, a substituted or unsubstituted piperazine, a substituted or unsubstituted aminomorpholine and a substituted or unsubstituted aminoalkylmorpholine. Examples of preferred substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxy group and a cyano group. Particularly preferred examples of the compound include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl)morpholine, trimethylimidazole triphenylimidazole and methyldiphenylimidazole. However, the present invention should not be construed as being limited thereto.

The nitrogen-containing basic compounds are used individually or in combination of two or more thereof in the present invention. The amount of the nitrogen-containing basic compound used is ordinarily from 0.001 to 10 parts by weight, preferably from 0.01 to 5 parts by weight, based on 100 parts by weight of the photoresist composition (excluding solvent). In the above-described range, the effects of the present invention are attained without reduction in sensitivity or deterioration in developing property of the exposed area.

The positive photoresist composition of the present invention is applied to a substrate to form a thin layer. A thickness of the layer coated is preferably from 0.2 to 4.0 μm.

In the present invention, known inorganic or organic antireflection film may be used, if desired.

Suitable examples of the antireflection film include an inorganic coating type such as titanium, titanium dioxide, titanium nitride, chromium oxide, carbon and α-silicon, and an organic coating type comprising a light absorbent and a polymer material. The former requires equipment such as a vacuum evaporation apparatus, a CVD apparatus and a sputtering apparatus, for the formation of coating. The organic antireflection film includes, for example, a coating comprising a condensate of a diphenylamine derivative with a formaldehyde-modified melamine resin, an alkali-soluble resin and a light absorbent as described in JP-B-7-69611 (the term "JP-B" as used herein means an "examined Japanese patent publication"), a coating comprising a reaction product of a maleic anhydride copolymer with a diamine-type light absorbent as described in U.S. Pat. No. 5,294,680, a coating comprising a resin binder and a methylolmelamine-base heat cross-linking agent as described in JP-A-6-118631, an acrylic resin-type antireflection film containing a carboxylic acid group, an epoxy group and a light absorbing group within the same molecule as described in JP-A-6-118656, a coating comprising methylolmelamine and a benzophenone-base light absorbent as described in JP-A-8-87115, and a coating obtained by adding a low molecular weight light absorbent to a polyvinyl alcohol resin as described in JP-A-8-179509.

Also, DTV-30 Series and DUV-40 Series (manufactured by Brewer Science, Inc.) and AC-2 and AC-3 (manufactured by Shipley Co., Ltd.) are employed as the organic antireflection film.

The above-described photoresist solution is coated on a substrate (e.g., silicon/silicon dioxide coating) which may have the above-described antireflection film provided thereon, if desired, for use in the production of a precision integrated circuit element by an appropriate coating means such as a spinner or coater, exposed through a predetermined mask, baked and developed to thereby obtain a good resist pattern.

The exposure light is preferably a far ultraviolet ray having a wavelength of from 150 nm to 250 nm. Specific examples thereof include a KrF excimer laser (248 nm), an ArF excimer laser (193 m), an $F_2$ excimer laser (157 nm), an X ray and an electron beam.

A developing solution which can be used for the photoresist composition according to the present invention is an alkaline aqueous solution of an inorganic alkali such as sodium hydroxide, potassium hydroxide, sodium carbonate, sodium silicate, sodium metasilicate and aqueous ammonia, a primary amine such as ethylamine and n-propylamine, a secondary amine such as diethylamine and di-n-butylamine, a tertiary amine such as triethylamine and methyldiethylamine, an alcohol amine such as dimethylethanolamine and triethanolamine, a quaternary ammonium salt such as tetramethylammonium hydroxide and tetraethylammonium hydroxide, and a cyclic amine such as pyrrole and piperidine.

To the alkaline aqueous solution, an appropriate amount of an alcohol or surface active agent may be added.

The positive photoresist composition of the present invention is suitable for exposure to a far ultraviolet ray, particularly a KrF excimer laser beam, is improved in line edge roughness and micro grain, is excellent in uniformity of carting on a substrate and has less particles in its resist solution.

The present invention will be described in greater detail with reference to the following examples, however, the present invention should not be construed as being limited thereto.

Synthesis of Resin

In the synthesis of resin, acetal-formation can be conducted using vinyl ether, or by an acetal exchange method using an alcohol and an alkyl vinyl ether. In order to efficiently and stably synthesize, an azeotropic dehydration method described below is preferably employed. These synthesis methods are described only for examples and the present invention should not be construed as being limited thereto.

Synthesis Example 1

Synthesis of Resin R-1

32.4 g (0.2 mols) of p-acetoxystyrene was dissolved in 120 ml of butyl acetate. To the solution was then added 0.033 g of azobisisobutylonitrile (AIBN) with stirring in a stream of nitrogen at a temperature of 80° C. every 2.5 hours three times in all. Thereafter, the mixture was stirred for 5 hours to undergo polymerization reaction. The reaction solution was then poured into 1,200 ml of hexane to cause the precipitation of a white resin. The resin thus obtained was dried, and then dissolved in 150 ml of methanol. To the solution was added a solution of 7.7 g (0.19 mols) of sodium hydroxide in 50 ml of water. The reaction solution was then heated under reflux for 3 hours to undergo hydrolysis. Thereafter, the reaction solution was diluted with 200 ml of water, and then neutralized with hydrochloric acid to cause the precipitation of a white resin. The resin thus obtained was collected by filtration, washed with water, and dried. The resin thus obtained was dissolved in 200 ml of tetrahydrofuran, and added dropwise to 5 liters of ultrapure water with vigorous stirring to reprecipitate. The reprecipitation procedure was then repeated three times. The resin thus obtained was dried at a temperature of 120° C. in a vacuum drier for 12 hours to obtain a poly(p-hydroxystyrene) type alkali-soluble resin R-1.

The weight average molecular weight of the resin was 12,000.

Synthesis Example 2

Synthesis of Resin R-2

35.25 g (0.2 mols) of a p-tert-butoxystyrene monomer which had been subjected to dehydration and purification by distillation in an ordinary manner and 5.21 g (0.05 mols) of tert-butylstyrene monomer were dissolved in 100 ml of tetrahydrofuran. To the solution was then added 0.033 g of azobisisobutylonitrile (AIBN) with stirring in a stream of nitrogen at a temperature of 80° C. every 2.5 hours three times in all. Thereafter, the mixture was stirred for 5 hours to undergo polymerization reaction. The reaction solution was then poured into 1,200 ml of hexane to cause the precipitation of a white resin. The thus obtained was dried, and then dissolved in 150 ml of tetrahydrofuran.

To the solution was added a 4 N hydrochloric acid. The reaction solution was then heated under reflux for 6 hours to undergo hydrolysis. Thereafter, the reaction solution was reprecipitated in 5 liters of ultrapure water. The resin thus obtained was collected by filtration, washed with water, and dried. The resin thus obtained was dissolved in 200 ml of tetrahydrofuran, and added dropwise to 5 liters of ultrapure water with vigorous stirring to reprecipitate. The reprecipitation procedure was then repeated three times. The resin thus obtained was dried at a temperature of 120° C. in a vacuum drier for 12 hours to obtain a poly (p-hydroxystyrene/(tert-butylstyrene) type alkali-soluble resin R-2.

The weight average molecular weight of the resin was 12,000.

Resin R-3

Poly(p-hydroxystyrene) (VP8000, manufactured by Nippon Soda Co., Ltd.) was designated an alkali-soluble resin R-3. The weight average molecular weight of the resin was 9,800.

Resin R-4

Poly(p-hydroxystyrene) (VP15000, manufactured by Nippon Soda Co., Ltd.) was designated an alkali-soluble resin R-4. The weight average molecular weight of the resin was 17,000.

Synthesis Example 3

Synthesis of Resin B-1

20 g of the alkali-soluble resin R-2 obtained in Synthesis Example 2 above and 320 g of propylene glycol monomethyl ether acetate (PGMEA) were dissolved in a flask and the solution was subjected to distillation under a reduced pressure to azeotropically distilled off water and PGMEA. After the confirmation of a sufficiently low content of water in the solution, 24 g of ethyl vinyl ether and 0.35 g of p-toluenesulfonic acid were added thereto, followed by stirring at a room temperature for one hour. Then, 0.28 g of triethylamine was added to the reaction mixture to quench the reaction.

To the reaction solution was added ethyl acetate and the mixture was washed with water and then distilled off ethyl acetate, water and the azeotrope portion of PGMEA under a reduced pressure to obtain an alkali-soluble resin B-1 having a substituent according to the present invention.

Synthesis Example 4

Synthesis of Resin B-2

70 g of the alkali-soluble resin R-3 described above and 320 g of propylene glycol monomethyl ether acetate (PGMEA) were dissolved in a flask and the solution was subjected to distillation under a reduced pressure to azeotropically distilled off water and PGMEA. After the confirmation of a sufficiently low content of water in the solution, 28 g of benzyl alcohol, 26 g of tert-butyl vinyl ether and 0.35 g of p-toluenesulfonic acid were added thereto, followed by stirring at a room temperature for one hour. Then, 0.1 g of triethylamine was added to the reaction mixture, followed by stirring at a room temperature for 10 minutes to quench the reaction.

To the reaction solution was added ethyl acetate and the mixture was washed with water and then distilled off ethyl acetate, water and the azeotrope portion of PGMEA under a reduced pressure to obtain an alkali-soluble resin B-2 having a substituent according to the present invention.

Synthesis Example 5

Synthesis of Resin B-3

70 g of the alkali-soluble resin R-2 obtained in Synthesis Example 2 above and 320 g of propylene glycol monomethyl ether acetate (PGMEA) were dissolved in a flask and the solution was subjected to distillation under a reduced pressure to azeotropically distilled off water and PGMEA. After the confirmation of a sufficiently low content of water in the solution, 20 g of cyclohexyl ethanol, 15.5 g of tert-butyl vinyl ether and 0.35 g of p-toluenesulfonic acid were added thereto, followed by stirring at a room temperature for one hour. Then, 0.28 g of triethylamine was added to the reaction mixture, followed by stirring at a room temperature for 10 minutes to quench the reaction.

To the reaction solution was added ethyl acetate and the mixture was washed with water and then distilled off ethyl acetate, water and the azeotrope portion of PGMEA under a reduced pressure to obtain an alkali-soluble resin B-3 having a substituent according to the present invention.

Synthesis Example 6

Synthesis of Resin B-4

70 g of the alkali-soluble resin R-3 described above and 320 g of propylene glycol monomethyl ether acetate (PGMEA) were dissolved in a flask and the solution was subjected to distillation under a reduced pressure to azeotropically distilled off water and PGMEA. After the confirmation of a sufficiently low content of water in the solution, 22 g of cyclohexyl ethanol, 17.5 g of tert-butyl vinyl ether and 0.35 g of p-toluenesulfonic acid were added thereto, followed by stirring at a room temperature for one hour. Then, 0.28 g of triethylamine was added to the reaction mixture, followed by stirring at a room temperature for 10 minutes to quench the reaction.

To the reaction solution was added ethyl acetate and the mixture was washed with water and then distilled off ethyl acetate, water and the azeotrope portion of PGMEA under a reduced pressure to obtain an alkali-soluble resin B-4 having a substituent according to the present invention.

Synthesis Example 7

Synthesis of Resin B-5

20 g of the alkali-soluble resin R-4 described above and 320 g of propylene glycol monomethyl ether acetate (PGCMEA) were dissolved in a flask and the solution was subjected to distillation under a reduced pressure to azeotropically distilled off water and PGMEA. After the confirmation of a sufficiently low content of water in the solution, 22.4 g of cyclohexyl ethanol, 17.5 g of tert-butyl vinyl ether and 0.35 g of p-toluenesulfonic acid were added thereto, followed by stirring at a room temperature for one hour. Then, 5.5 g of pyridine and thereafter 5.9 g of acetic anhydride were added to the reaction mixture, followed by stirring at a room temperature for one hour.

To the reaction solution was added ethyl acetate and the mixture was washed with water and then distilled off ethyl acetate, water and the azeotrope portion of PGMEA under a reduced pressure to obtain an alkali-soluble resin B-5 having a substituent according to the present invention.

Synthesis Example 8

Synthesis of Resin B-6

20 g of the alkali-soluble resin R-1 obtained in Synthesis Example 1 above and 320 g of propylene glycol monomethyl ether acetate (PGMEA) were dissolved in a flask and the solution was subjected to distillation under a reduced pressure to azeotropically distilled off water and PGMEA. After the confirmation of a sufficiently low content of water in the solution, 22.4 g of cyclohexyl ethanol, 17.5 g of tert-butyl vinyl ether and 0.35 g of p-toluenesulfonic acid were added thereto, followed by stirring at a room temperature for one hour. Then, 5.5 g of pyridine and thereafter 5.9 g of acetic anhydride were added to the reaction mixture, followed by stirring at a room temperature for one hour.

To the reaction solution was added ethyl acetate and the mixture was washed with water and then distilled off ethyl acetate, water and the azeotrope portion of PGMEA under a reduced pressure to obtain an alkali-soluble resin B-6 having a substituent according to the present invention.

EXAMPLES 1 TO 19

AND

COMPARATIVE EXAMPLES 1 TO 8

<Preparation and Evaluation of Photo-sensitive Resin Composition>

Each of the components described in Tables 1 and 2 shown below were dissolved in a mixture of the solvents in the weight ratio described in Tables 1 and 2 shown below in such a proportion as to result in a solid content of 12% by weight and filtered through a micro-filter of 0.1 $\mu$m to prepare positive photoresist solutions for Examples 1 to 19 and Comparative Examples 1 to 8, respectively.

The positive photoresist solution thus-obtained was coated on a silicon wafer using a spin coater (Mark 8, manufactured by Tokyo Electron Ltd.) and dried at 120° C. for 90 seconds to prepare a resist film having a thickness of about 0.4 $\mu$m. The resist film was exposed to a Kr F excimer laser (wavelength: 248 nm, NA=0.63, sigma=0.65) using a device (FPA-3000EX5, manufactured by Canon Inc.). The exposed resist film was subjected to heat treatment at 100° C. for 90 seconds, developed with a 2.38% aqueous tetramethyl ammonium hydroxide solution, rinsed with pure water and spin-dried to prepare a resist pattern.

TABLE 1

| Example | Alkali-Soluble Resin | Photo-Acid Generator | Additive (0.4 wt %) | Surface Active Agent* | Solvent |
|---|---|---|---|---|---|
| 1 | B-1 (97.6 wt %) | D-1 (2 wt %) | E-2 | F-2 | S1/S4 (=8/2 wt ratio) |
| 2 | B-1 (95.6 wt %) | D-3 (4 wt %) | E-2 | F-2 | S1/S4 (=8/2 wt ratio) |
| 3 | B-2 (97.6 wt %) | D-1 (2 wt %) | E-2 | F-2 | S1/S4 (=8/2 wt ratio) |
| 4 | B-3 (97.6 wt %) | D-1 (2 wt %) | E-2 | F-2 | S1/S4 (=8/2 wt ratio) |
| 5 | B-4 (97.6 wt %) | D-1 (2 wt %) | E-2 | F-2 | S1/S4 (=8/2 wt ratio) |
| 6 | B-5 (97.6 wt %) | D-1 (2 wt %) | E-2 | F-1 | S1/S4 (=95/5 wt ratio) |
| 7 | B-5 (97.6 wt %) | D-1 (2 wt %) | E-2 | F-1 | S1/S4 (=90/10 wt ratio) |
| 8 | B-5 (97.6 wt %) | D-1 (2 wt %) | E-2 | F-1 | S1/S4 (=80/20 wt ratio) |
| 9 | B-5 (97.6 wt %) | D-1 (2 wt %) | E-2 | F-1 | S1/S4 (=70/30 wt ratio) |
| 10 | B-5 (97.6 wt %) | D-1 (2 wt %) | E-2 | F-1 | S1/S4/S6 (=80/10/10 wt ratio) |
| 11 | B-5 (97.6 wt %) | D-1 (2 wt %) | E-2 | F-1 | S1/S4/S8 (=80/10/10 wt ratio) |
| 12 | B-5 (97.6 wt %) | D-1 (2 wt %) | E-2 | F-1 | S1/S5/S8 (=80/10/10 wt ratio) |
| 13 | B-5 (97.6 wt %) | D-1 (2 wt %) | E-2 | F-1 | S1/S5 (=90/10 wt ratio) |
| 14 | B-5 (95.6 wt %) | D-3 (4 wt %) | E-2 | F-1 | S1/S4 (=80/20 wt ratio) |
| 15 | B-5 (95.6 wt %) | D-3 (4 wt %) | E-2 | F-1 | S1/S4/S8 (=60/30/10 wt ratio) |
| 16 | B-5 (95.6 wt %) | D-3 (4 wt %) | E-2 | F-1 | S2/S4/S8 (=70/20/10 wt ratio) |
| 17 | B-6 (97.6 wt %) | D-1 (2 wt %) | E-2 | F-1/F-2 (*2) | S1/S4 (=80/20 wt ratio) |
| 18 | B-5 (95.6 wt %) | D-1 (2 wt %) | E-1 | F-2 | S1/S5 (=60/40 wt ratio) |
| 19 | B-5 (95.6 wt %) | D-2 (2 wt %) | E-1 | F-1 | S1/S5 (=90/10 wt ratio) |

*The amount of surface active agent added was 100 ppm in the above resist solution.
(*2) Mixing ratio = 1:1 (weight ratio)

TABLE 2

| Example | Alkali-Soluble Resin | Photo-Acid Generator | Additive (0.4 wt %) | Surface Active Agent* | Solvent |
|---|---|---|---|---|---|
| 1 | B-1 (97.6 wt %) | D-1 (2 wt %) | E-2 | none | S1 alone |
| 2 | B-1 (95.6 wt %) | D-3 (4 wt %) | E-2 | none | S1 alone |
| 3 | B-2 (97.6 wt %) | D-1 (2 wt %) | E-2 | none | S1 alone |
| 4 | B-3 (97.6 wt %) | D-1 (2 wt %) | E-2 | none | S1 alone |
| 5 | B-4 (97.6 wt %) | D-1 (2 wt %) | E-2 | F-1 | S1 alone |
| 6 | B-5 (97.6 wt %) | D-1 (2 wt %) | E-2 | F-1 | S1 alone |
| 7 | B-5 (95.6 wt %) | D-3 (4 wt %) | E-2 | F-2 | S1 alone |
| 8 | B-6 (97.6 wt %) | D-1 (2 wt %) | E-2 | F-2 | S1 alone |

*The amount of surface active agent added was 100 ppm in the above resist solution.
S1: Propylene glycol monomethyl ether acetate
S2: Propylene glycol monomethyl ether propionate
S4: Propylene glycol monomethyl ether
S5: Ethoxyethyl propionate
S6: γ-Butyrolactone TABLE 2-continued

| Example | Alkali-Soluble Resin | Photo-Acid Generator | Additive (0.4 wt %) | Surface Active Agent* | Solvent |
|---|---|---|---|---|---|

S7: Ethylene carbonate
S8: Propylene carbonate
Surface Active Agent (F-1): Megafac R08 (manufactured by Dainippon Ink and Chemicals, Inc.)
Surface Active Agent (F-2): Troysol S-366 (manufactured by Troy Chemical Co., Ltd)

(D-1)

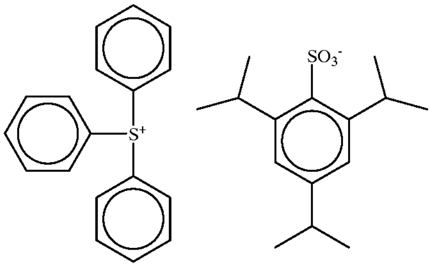

-continued (D-2)

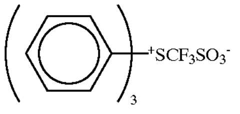

(D-3)

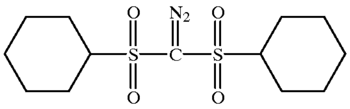

(E-1)

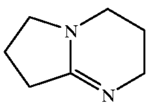

(E-2)

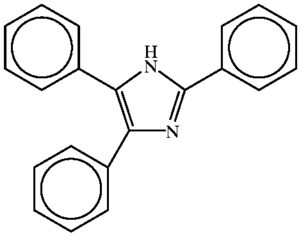

With each composition, line edge roughness, micro grain, particle in solution and uniformity of film were evaluated in the following manner.

<Line Edge Roughness>

50 Points in an area with a length of 5 m of the line pattern of 0.16 rim in width was measured using a device (S8840, manufactured by Hitachi, Ltd.) and $3\sigma$ was determined. The smaller the value, the better the quality.

<Micro Grain>

The surface of the line pattern of 0.16 μm in width was observed using a length-measuring SEM (S-8840, manufactured by Hitachi, Ltd.) of 80,000 magnifications. The degree of occurrence of extraneous substances (micro grain: granular extraneous substances having the grain diameter of from 30 nm to 100 nm which are formed on the pattern surface after the development) observed on the surface of the pattern was measured and classified into three groups as described below for the evaluation.

A: not observed

B: somewhat observed

C: numerously observed

<Particle in Solution>

The number of the p articles of 0.25 μm or more present in the resist solution after the filtration was measured using a device (KL-22, manufactured by Rion Co., Ltd.). The number of particles par one ml of the solution was described in the tables below.

<Uniformity of Film>

The resist solution was spin-coated on Bare Si substrate of 6×6 inches and heated. Thickness of the resist film was measured at 50 points of the whole surface of the resist film using a device (Lambda-Ace VM-8200, manufactured by Dainippon Screen Mfg. Co., Ltd.). Difference between the maximum value of the thickness and the minimum value of the thickness was determined and described in the tables below.

TABLE 3

| | Line Edge Roughness (mm) | Micro Grain | Particle in Solution (number/ml) | Uniformity of Film (angstrom) |
|---|---|---|---|---|
| Example | | | | |
| 1 | 5 | B | 5 | 10 |
| 2 | 7 | A | 6 | 9 |
| 3 | 5 | B | 8 | 13 |
| 4 | 4 | B | 5 | 7 |
| 5 | 6 | B | 6 | 9 |
| 6 | 5 | B | 4 | 7 |
| 7 | 4 | B | 4 | 5 |
| 8 | 3 | A | 3 | 5 |
| 9 | 3 | A | 2 | 4 |
| 10 | 4 | B | 4 | 8 |
| 11 | 3 | A | 3 | 5 |
| 12 | 3 | A | 3 | 5 |
| 13 | 4 | B | 4 | 6 |
| 14 | 4 | A | 3 | 5 |
| 15 | 4 | A | 3 | 5 |
| 16 | 4 | A | 4 | 7 |
| 17 | 4 | A | 5 | 6 |
| 18 | 4 | A | 4 | 5 |
| 19 | 5 | A | 6 | 6 |
| Comparative Example | | | | |
| 1 | 14 | C | 15 | 18 |
| 2 | 12 | C | 17 | 19 |
| 3 | 17 | C | 19 | 25 |
| 4 | 14 | C | 10 | 15 |
| 5 | 12 | C | 11 | 17 |
| 6 | 16 | C | 8 | 15 |
| 7 | 21 | B | 18 | 14 |
| 8 | 19 | B | 17 | 16 |

As is apparent from the results shown in Table 3 above, the resist composition of the present invention exhibits satisfactory results in any of the line edge roughness, micro grain, uniformity of film coated on a substrate and particle in a resist solution.

While the invention has been described in detail and with reference to specific examples thereof, it will be apparent to one skilled in the art that various changes and modifications can be made therein without departing from the spirit and scope thereof.

This application is based on Japanese patent application No. Hei-11-364904 filed on Dec. 22, 1999, the entire contents of which incorporated herein by reference.

What is claimed is:

1. A positive photoresist composition for exposure to a far ultraviolet ray which comprises (A) a compound which generates an acid upon irradiation with an actinic ray or radiation, (B) a resin which contains a repeating unit corresponding to hydroxystyrene and which decomposes by the action of an acid to increase solubility in an alkaline developing solution, (C)(1) at least one solvent selected from the group consisting of propylene glycol monomethyl ether acetate and propylene glycol monomethyl ether propionate, and (2) at least one solvent selected from the group consisting of propylene glycol monomethyl ether and ethoxyethyl propionate and (D) an organic basic compound.

2. The positive photoresist composition for exposure to a far ultraviolet ray as claimed in claim 1, wherein the composition further comprises at least one solvent selected from the group consisting of γ-butyrolactone, ethylene carbonate and propylene carbonate.

3. The positive photoresist composition for exposure to a far ultraviolet ray as claimed in claim 1, wherein the resin (B) contains a repeating unit represented by formula (IV) shown below and a repeating unit represented by formula (V) shown below:

(IV)

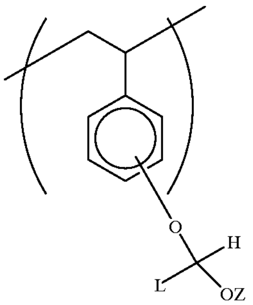

(V)

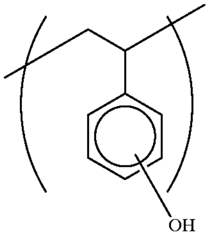

wherein L represents a hydrogen atom, a straight-chain, branched chain or cyclic alkyl group which may be substituted or an aralkyl group which may be substituted; Z represents a straight-chain, branched chain or cyclic alkyl group which may be substituted or an aralkyl group which may be substituted; or Z and L may be combined with each other to form a 5-membered or 6-membered ring.

4. The positive photoresist composition for exposure to a far ultraviolet ray as claimed in claim 1, wherein the compound which generates an acid upon irradiation with an actinic ray or radiation is that selected from diazonium salts, ammonium salts, phosphonium salts, iodonium salts, sulfonium salts, selenonium salts, arsonium salts, organic halide compounds, organic metal/organic halide compounds, photo-acid generators having an o-nitrobenzyl type protective group, compounds which photolyze to generate a sulfonic acid, disulfone compounds, diazoketosulfone compounds and diazodisulfone compounds.

5. The positive photoresist composition for exposure to a far ultraviolet ray as claimed in claim 1, wherein the compound which generates an acid upon irradiation with an actinic ray or radiation is an oxazole derivative substituted with a trihalomethyl group represented by formula (PAG1) shown below or an s-triazine derivative substituted with a trihalomethyl group represented by formula (PAG2) shown below:

(PAG1)

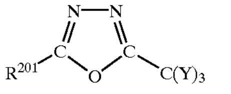

(PAG2)

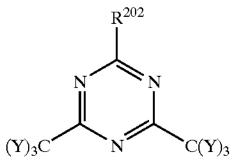

wherein $R^{201}$ represents a substituted or unsubstituted aryl group or alkenyl group , $R^{202}$ represents a substituted or unsubstituted aryl group, alkenyl group or alkyl group, or $—C(Y)_3$, and Y represents a chlorine atom or a bromine atom.

6. The positive photoresist composition for exposure to a far ultraviolet ray as claimed in claim 1, wherein the compound which generates an acid upon irradiation with an actinic ray or radiation is an iodonium salt represented by formula (PAG3) shown below or a sulfonium salt represented by formula (PAG4) shown below:

(PAG3)

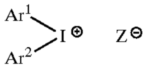

(PAG4)

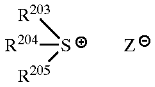

wherein $Ar^1$ and $Ar^2$ each independently represents a substituted or unsubstituted aryl group; $R^{203}$, $R^{204}$ and $R^{205}$ each independently represents a substituted or unsubstituted alkyl group or aryl group, or two of $R^{203}$, $R^{204}$ and $R^{205}$ or $Ar^1$ and $Ar^2$ may be combined through a single bond or a substituent; and Z– represents a counter anion.

7. The positive photoresist composition for exposure to a far ultraviolet ray as claimed in claim 1, wherein the compound which generates an acid upon irradiation with an actinic ray or radiation is a disulfone derivative represented by formula (PAG5) shown below or an iminosulfonate derivative represented by formula (PAG6) shown below:

$Ar3—SO_2—SO_2—Ar^4$ (PAG5)

(PAG6)

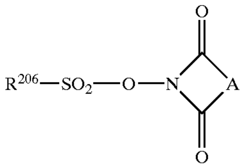

wherein $Ar^3$ and $Ar^4$ each independently represents a substituted or unsubstituted aryl group, $R^{206}$ represents a substituted or unsubstituted alkyl group or aryl group, and A represents a substituted or unsubstituted alkylene group, alkenylene group or arylene group.

8. The positive photoresist composition for exposure to a far ultraviolet ray as claimed in claim 1, wherein the compound which generates an acid upon irradiation with an actinic ray or radiation is a diazodisulfone derivative represented by formula (PAG7) shown below:

(PAG7)

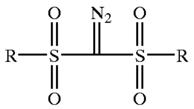

wherein R represents a straight-chain, branched chain or cyclic alkyl group or an aryl group which may be substituted.

9. The positive photoresist composition for exposure to a far ultraviolet ray as claimed in claim 1, wherein the resin has an acid-decomposable group in the polymer main chain or side chain, or both the polymer main chain and side chain.

10. The positive photoresist composition for exposure to a far ultraviolet ray as claimed in claim 9, wherein the acid-decomposable group is a group represented by formula $—COOA^0$ or $—O—B^0$ wherein $A^0$ represents $—C(R^{01})(R^{02})(R^{03})$, $—Si(R^{01})(R^{02})(R^{03})$ or $—C(R^{04})(R^{05})—O—(R^{06})$; $B^0$ represents $—A^0$ or $—COO—A^0$; $R^{01}$, $R^{02}$, $R^{03}$, $R^{04}$ and $R^{05}$, which may be the same or, different, each represents a hydrogen atom, an alkyl group, a cycloalkyl group, an alkenyl group or an aryl group; and $R^{06}$ represents an alkyl group or an aryl group, provided that at least two of $R^{01}$ to $R^{03}$ are not hydrogen atoms; or two of $R^{01}$ to $R^{03}$ are bonded to each other to form a ring or two of $R^{04}$ to $R^{06}$ are bonded to each other to form a ring.

11. The positive photoresist composition for exposure to a far ultraviolet ray as claimed in claim 1, wherein the resin is that whose 1 μm-thick film has transmittance at 248 nm of from 20% to 90%.

12. The positive photoresist composition for exposure to a far ultraviolet ray as claimed in claim 3, wherein a molar ratio of the repeating unit represented by formula (IV)/the repeating unit represented by formula (V) present in the resin is preferably from 1/99 to 60/40.

13. The positive photoresist composition for exposure to a far ultraviolet ray as claimed in claim 1, wherein the composition further comprises a fluorine-base and/or silicon-base surface active agent.

14. The positive photoresist composition for exposure to a far ultraviolet ray as claimed in claim 1, wherein the organic basic compound is a nitrogen-containing basic compound having the structure represented by the following formula (A), (B), (C), (D) or (E):

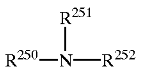

(A)

wherein $R^{250}$, $R^{251}$ and $R^{252}$, which may be the same or different, each represents a hydrogen atom, an alkyl group having from 1 to 6 carbon atoms, an aminoalkyl group having from 1 to 6 carbon atoms, a hydroxyalkyl group having from 1 to 6 carbon atoms or a substituted or unsubstituted aryl group having from 6 to 20 carbons atoms, or $R^{251}$ and $R^{252}$ may be combined with each other to form a ring;

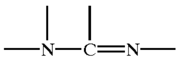

(B)

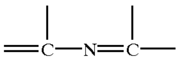

(C)

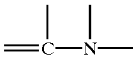

(D)

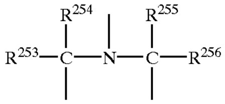

(E)

wherein $R^{253}$, $R^{254}$, $R^{255}$ and $R^{256}$, which may be the same or different, each represents an alkyl group having from 1 to 6 carbon-atoms.

15. The positive photoresist composition for exposure to a far ultraviolet ray as claimed in claim 1, wherein the organic basic compound is a nitrogen-containing cyclic compound represented by the following formula (VI):

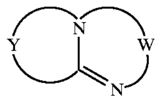

(VI)

wherein Y and W, which may be the same or different, each represents a straight-chain, branched or cyclic alkylene group which may contain a hetero atom or may be substituted.

* * * * *